United States Patent
Lee et al.

(10) Patent No.: US 8,035,136 B2
(45) Date of Patent: Oct. 11, 2011

(54) SEMICONDUCTOR DEVICE AND METHOD OF MANUFACTURING THE SAME

(75) Inventors: Sung-Sam Lee, Gyeonggi-do (KR); Joon-Seok Moon, Seoul (KR); Young-Ju Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 12/508,305

(22) Filed: Jul. 23, 2009

(65) Prior Publication Data
US 2010/0019302 A1  Jan. 28, 2010

(30) Foreign Application Priority Data
Jul. 24, 2008  (KR) .......................... 10-2008-0072245

(51) Int. Cl.
*H01L 29/76* (2006.01)
*H01L 21/336* (2006.01)
(52) U.S. Cl. ................. 257/213; 257/E27.091; 438/259
(58) Field of Classification Search .................. 257/306, 257/E27.071, E21.616, E21.011, 213, 302, 257/E27.091; 438/253, 242, 259, 561
See application file for complete search history.

(56) References Cited

U.S. PATENT DOCUMENTS
6,939,751 B2    9/2005  Zhu et al.
2007/0042583 A1 *  2/2007  Jang et al. ..................... 438/585
2007/0045725 A1    3/2007  Yun et al.

FOREIGN PATENT DOCUMENTS
KR    1020050116707 A    12/2005
* cited by examiner

*Primary Examiner* — Thomas L Dickey
*Assistant Examiner* — Nikolay Yushin
(74) *Attorney, Agent, or Firm* — Myers Bigel Sibley & Sajovec, P.A.

(57) ABSTRACT

In a semiconductor device and a method of manufacturing the same, a substrate is defined into active and non-active regions by a device isolation layer and a recessed portion is formed on the active region. A gate electrode includes a gate insulation layer on an inner sidewall and a bottom of the recessed portion, a lower electrode on the gate insulation layer and an inner spacer on the lower electrode in the recessed portion, and an upper electrode that is positioned on the inner spacer and connected to the lower electrode. Source and drain impurity regions are formed at surface portions of the active region of the substrate adjacent to the upper electrode. Accordingly, the source and drain impurity regions are electrically insulated by the inner spacer in the recessed portion of the substrate like a bridge, to thereby sufficiently prevent gate-induced drain leakage (GIDL) at the gate electrode.

17 Claims, 35 Drawing Sheets

SEMICONDUCTOR DEVICE AND METHOD OF MANUFACTURING THE SAME

CROSS-REFERENCE TO RELATED APPLICATIONS

This application claims the benefit of Korean Patent Application No. 10-2008-0072245, filed on Jul. 24, 2008, in the Korean Intellectual Property Office, the disclosure of which is incorporated herein in its entirety by reference.

BACKGROUND

1. Field

Example embodiments relate to a semiconductor device and a method of manufacturing the same, and more particularly, to a semiconductor device including a recess channel array transistor (RCAT) structure, in which a gate electrode includes a bridge-shaped inner spacer, and a method of manufacturing the same.

2. Description of the Related Art

As semiconductor memory devices are becoming more highly integrated, unit cell areas, line widths and intervals of patterns, and channel lengths are being reduced. Accordingly, leakage currents may increase due to short channel effects and large amounts of dopants being implanted into semiconductor substrates, which may reduce the refresh times of the semiconductor substrates.

A semiconductor device can be manufactured into a vertical gate structure and/or as a stacked gate structure to maintain electrical characteristics of the semiconductor device when a cell area is reduced. In addition, novel materials may be used for the gate structure of the semiconductor device to address the deterioration of the electric characteristics, in order to avoid modification of the gate structure.

A trench-type gate electrode has been utilized to increase the channel length at the gate electrode despite the cell area reduction. A recess channel array transistor (RCAT) structure, particularly, a spherical RCAT (SRCAT) structure, has been used as the trench-type gate electrode in a semiconductor device. In a conventional RCAT structure, a channel region of a gate electrode is usually recessed into a channel trench, and thus the channel length of the gate electrode can be sufficiently increased due to the increased surface area of the trench. Accordingly, the conventional RCAT structure may have a sufficient channel length despite the reduction of the cell area.

The conventional RCAT structure usually includes an inner spacer on an inner sidewall of the channel trench for reducing gate-induced drain leakage (GIDL). However, the above cell area reduction caused by the increase of integration degree may also reduce an available area for the inner spacer. The inner spacer for reducing the GIDL may be difficult to form on the inner sidewall of the channel trench, which may affect the GIDL in the conventional RCAT structure as the cell area is reduced.

According to the conventional RCAT structure, the channel trench can be formed on an active region of a substrate and a gate insulation layer can be formed along the inner sidewall of the channel trench. A lower portion of the gate structure can be formed in the channel trench and an upper portion of the gate structure can protrude from a surface of the substrate. An upper spacer can be formed on a sidewall of the upper portion of the gate electrode and an inner spacer can be formed between the lower portion of the gate electrode and the inner sidewall of the channel trench. Thus, the GIDL may be reduced at the gate electrode by the inner spacer.

There has been reported that the GIDL reduction is usually proportional to a depth and/or the width of the inner spacer. However, the increase of integration degree and the downsizing of the minimum feature size of a semiconductor device, for example, below about $4F^2$ (F: minimum feature size), may place various limitations on how much the depth and/or the width of the inner spacer can be increased, and thus the GIDL may be increased in the conventional RCAT structure as the cell area is reduced. Accordingly, the RCAT structure may be inappropriate for some semiconductor devices despite the various advantages of the conventional RCAT structure. In some cases, the RCAT structure may be completely replaced by a vertical pillar transistor (VPT) structure, and thus an RCAT structure may not be used in some semiconductor devices where the GIDL may not be sufficiently reduced.

SUMMARY

According to some example embodiments, there is provided a semiconductor device including a semiconductor substrate defined into an active region on which a recessed portion is arranged and a non-active region by a device isolation layer, a gate electrode including a gate insulation layer on an inner sidewall and a bottom of the recessed portion, a lower electrode on the gate insulation layer at a lower portion of the recessed portion, an inner spacer on the lower electrode at an upper portion of the recessed portion, and an upper electrode that is positioned on the inner spacer and connected to the lower electrode; and source and drain impurity regions at surface portions of the active region of the substrate adjacent to the upper electrode, the source and drain impurity regions being electrically insulated by the inner spacer.

In an example embodiment, a lower surface of the inner spacer may be lower than the source and the drain impurity regions, and an upper surface of the inner spacer may be equal to or lower than a surface of the substrate. Thus, the inner spacer is interposed between the source and drain impurity regions under the upper electrode. For example, the inner spacer includes silicon nitride.

In an example embodiment, the bottom of the recessed portion may be shaped into a hemisphere, so that the lower electrode includes a spherical surface.

In an example embodiment, the semiconductor device may further include a connection electrode in a connection opening between a stacked structure of the lower electrode and the inner spacer and the device isolation layer at a boundary region of the recessed portion and the non-active region along a longitudinal direction of the recessed portion, the connection electrode may connect the upper electrode and the lower electrode to each other. For example, the connection electrode is shaped into one body together with the upper electrode and makes contact with the lower electrode.

In an example embodiment, the gate insulation layer may be further interposed between the inner spacer and the lower electrode in the recessed portion of the substrate. As a modified example, the lower electrode and the inner spacer make direct contact with each other in the recessed portion of the substrate.

In an example embodiment, the semiconductor device may further include a bit line electrically connected to the drain impurity region and a capacitor electrically connected to the source impurity region.

In an example embodiment, the capacitor may include a first electrode electrically connected to the source impurity regions, a dielectric layer on the first electrode and a second electrode on the dielectric layer. The first and second electrodes of the capacitor may include any one material selected from the group consisting of titanium nitride (TiN), titanium (Ti), tantalum nitride (TaN), platinum (Pt) and combinations thereof and the dielectric layer may include any one material selected from the group consisting of zirconium (Zr), hafnium oxide (HfO) and combinations thereof.

In an example embodiment, the bit line extends in a first direction parallel with the width of the recessed portion and a plurality of the gate electrodes is arranged in a line extending in a second direction substantially perpendicular to the first direction.

According to some example embodiments, there is provided a method of manufacturing a semiconductor device. A semiconductor substrate may be prepared in such a manner that an active region and a non-active region may be defined on the substrate by a device isolation layer and the active region may have a recessed portion on the substrate. A gate electrode may be formed on the substrate in such a manner that a gate insulation layer may be formed on an inner sidewall and a bottom of the recessed portion, a lower electrode being formed on the gate insulation layer in the recessed portion, an inner spacer being formed on the lower electrode in the recessed portion, and an upper electrode being formed on the inner spacer and connected to the lower electrode. Source and drain impurity regions may be formed at surface portions of the active region of the substrate adjacent to the upper electrode. The source and drain impurity regions may be electrically insulated by the inner spacer.

In an example embodiment, the semiconductor substrate may be prepared in the following steps: a device isolation layer may be formed at the non-active region of the substrate in such a manner that neighboring active regions are electrically isolated from each other, and the active region of the substrate may be partially etched off to thereby form the recessed portion at the active region of the substrate.

In an example embodiment, after forming the recessed portion, an etch-protection layer may be further formed on an inner sidewall of the recessed portion and an isotropic etching process may be performed against the bottom of the recessed portion, so that the bottom of the recessed portion is shaped into a hemisphere.

In an example embodiment, the gate electrode may be formed as follows. A sacrificial layer may be formed at a lower portion of recessed portion. The inner spacer may be formed on the sacrificial layer at an upper portion of the recessed portion. A connection opening may be formed on the substrate in such a manner that the recessed portion may be enlarged along a longitudinal direction and the sacrificial layer under the inner spacer is exposed through the connection opening. The sacrificial layer may be removed from the recessed portion, to thereby form an electrode space at the lower portion of the recessed portion. The gate insulation layer may be formed on an inner sidewall and a bottom of the recessed portion that define the electrode space and on the substrate. The lower electrode and the connection electrode may be formed in the electrode space and in the connection opening, respectively. The upper electrode may be formed on the substrate in such a manner that the inner spacer may be covered with the upper electrode and the lower electrode may be connected to the upper electrode via the connection electrode.

In an example embodiment, the connection opening may be formed as follows. A mask pattern may be formed on the substrate such that a boundary region of the recessed portion and the non-active region is exposed through the mask pattern along a longitudinal direction of the recessed portion, so that a stacked structure of the lower electrode and the inner spacer and the device isolation layer is partially exposed through the mask pattern. The stacked structure and the device isolation layer may be removed from the boundary region of the substrate by an etching process using the mask pattern as an etching mask. For example, the sacrificial layer may be removed by a wet etching process using an etchant supplied to the sacrificial layer through the connection opening.

In an example embodiment, wherein the inner spacer may be enclosed by the gate insulation layer.

In an example embodiment, the gate electrode may be formed as follows. The gate insulation layer may be formed on an inner sidewall and a bottom of the recessed portion and on the substrate. A lower electrode may be formed at a lower portion of the recessed portion and the inner spacer may be formed on the lower electrode at an upper portion of the recessed portion. A connection opening may be formed such that the recessed portion may be enlarged along a longitudinal direction and the lower electrode under the inner spacer may be exposed through the connection opening. The connection electrode may be formed in the connection opening. The upper electrode may be formed on the substrate such that the inner spacer may be covered with the upper electrode and the lower electrode may be connected to the upper electrode via the connection electrode.

In an example embodiment, the upper electrode and the connection electrode may be formed into one body in a single process, and the connection electrode may make direct contact with the lower electrode.

According to some example embodiments of the present inventive step, the source and drain regions may make contact with an inner spacer in the recessed portion of the substrate like a bridge in the RCAT/SRCAT structure, to thereby sufficiently prevent GIDL at the gate electrode and improve the refresh time of the transistor in spite of the downsizing of a minimum feature size of a semiconductor device.

BRIEF DESCRIPTION OF THE DRAWINGS

Example embodiments will be more clearly understood from the following detailed description taken in conjunction with the accompanying drawings.

DETAILED DESCRIPTION OF THE EMBODIMENTS

Figure 1A:
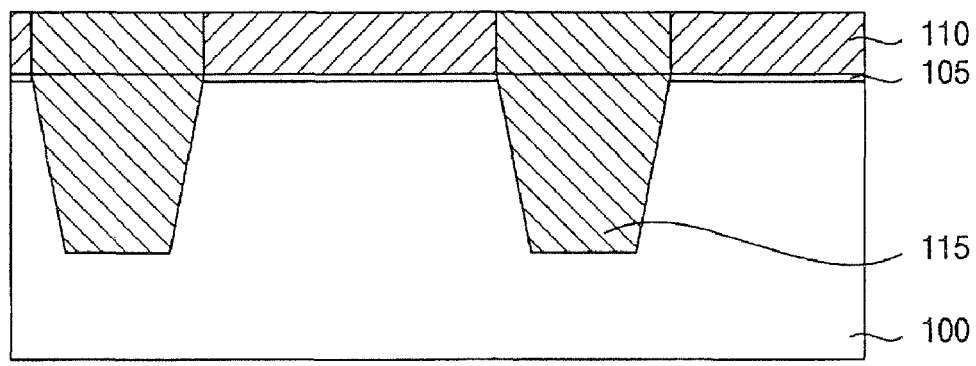
FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A and 12B are cross-sectional views illustrating processing steps for a method of forming a recess channel array transistor (RCAT) structure for a semiconductor device in accordance with an example embodiment of the inventive concept.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1A to 12B are cross-sectional views illustrating processing steps for a method of forming an RCAT structure for a semiconductor device in accordance with an example embodiment of the inventive concept. In the present example embodiment, a bridge-shaped inner spacer may be formed at a gate electrode of the RCAT structure, to thereby sufficiently reduce gate-induced drain leakage (GIDL) in the RCAT structure.

In FIGS. 1A to 12B, a figure having the suffix letter A illustrates a cross-sectional view cut along a first line, for example, the x-axis of a rectangular coordinate system and a figure having the suffix letter B illustrates a cross-sectional view cut along a second line perpendicular to the first line, for example, the y-axis of the rectangular coordinate system. In a case where the RCAT structure is used in a memory device, the x-axis may be parallel with a bit line of the memory device and the y-axis may be parallel with a word line of the memory device.

Figure 1B:
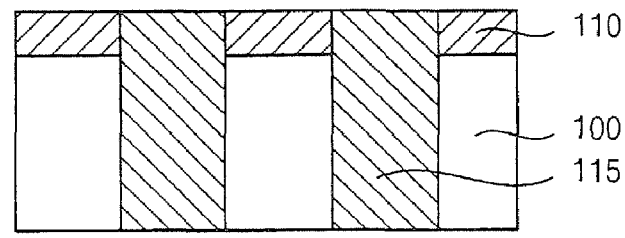

Referring to FIGS. 1A and 1B, a pad oxide layer (not shown) may be formed on a substrate 100 such as a semiconductor wafer to a thickness of about 50 Å to about 150 Å by an oxidation process such as a thermal oxidation process. The pad oxide layer may be formed into a pad oxide pattern 105 by a subsequent patterning process.

A first hard mask layer (not shown) may be formed on the pad oxide layer. The first hard mask layer may comprise a material having an etching selectivity with respect to the substrate 100 and the pad oxide layer. Examples of the material for the first hard mask layer may include silicon nitride.

The first hard mask layer may be formed into a hard mask pattern 110 by a subsequent patterning process. The pad oxide pattern 105 and the first hard mask pattern 110 may be formed on the substrate 100 simultaneously or individually by the same patterning process or a respective patterning process. The substrate 100 may be partially etched off by an etching process using the first hard mask pattern as an etching mask, to thereby form a trench on the substrate 100. Then, an insulation material may be filled into the trench, and thus an insulation pattern 115 may be formed along the trench on the substrate 100. Adjacent conductive structures on the substrate 100 may be electrically isolated from each other by the insulation pattern in the trench, and thus the insulation pattern 115 may hereinafter be referred to as device isolation pattern. That is, the substrate 100 may be divided into an active region and a field region by the device isolation pattern 115.

In an example embodiment, the device isolation pattern 115 may be formed on the substrate 100 by a shallow-trench isolation (STI) process. For example, a thermal oxide layer may be formed on an inner sidewall of the trench on the substrate and a liner may be formed on the thermal oxide layer in the trench. Then, the insulation material may be deposited into the trench to a sufficient thickness to fill up the trench by a deposition process such as a chemical vapor deposition (CVD) process or a high-density plasma CVD (HDP-CVD) process, to thereby form an insulation layer (not shown) on the substrate 100. Then, the insulation layer may be planarized by a planarization process such as a chemical mechanical polishing (CMP) process until a surface of the first hard mask pattern 110 is exposed, to thereby form the device isolation pattern 115 along the trench on the substrate 100.

In an example embodiment, various conductive structures such as a gate structure may be formed on the active region of the substrate 100 and the conductive structures may be surrounded by the device isolation pattern 115 on the field region of the substrate 100. Thus, the adjacent conductive structures on the active region may be electrically isolated from each other by the device isolation pattern 115 on the field region that is a non-active region of the substrate.

Figure 2A:
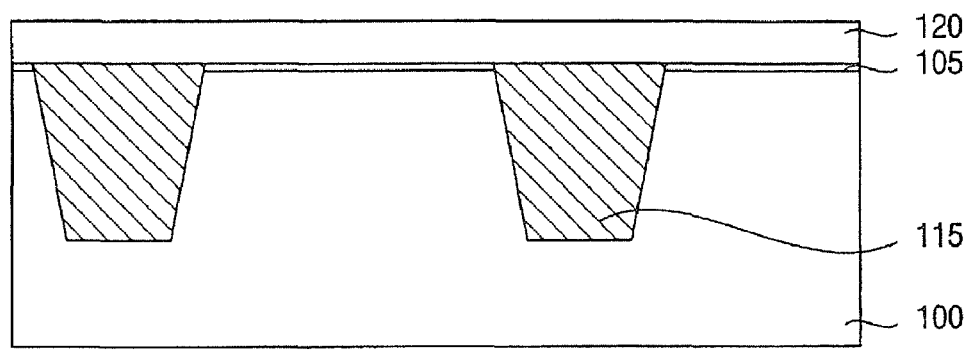
Figure 2B:
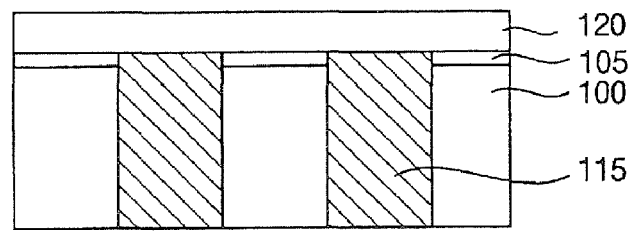

Referring to FIGS. 2A and 2B, the first hard mask pattern 110 may be removed from the substrate 100 and an upper portion of the device isolation pattern 115 may be planarized by a planarization process in such a manner that a top surface of the device isolation pattern 115 may be coplanar with the surface of the pad oxide pattern 105. Then, a second hard mask layer 120 may be formed on the device isolation pattern 115 and the pad oxide pattern 105. In the present example embodiment, the second mask layer 120 may comprise the same material as the first hard mask layer. As a modification of the present processing step, the pad oxide pattern 105 may be removed from the substrate 100 before the formation of the second hard mask layer 120 and then another pad oxide pattern (not shown) may be formed on the active region of the substrate 100 by the same process as the pad oxide pattern 105.

Figure 3A:
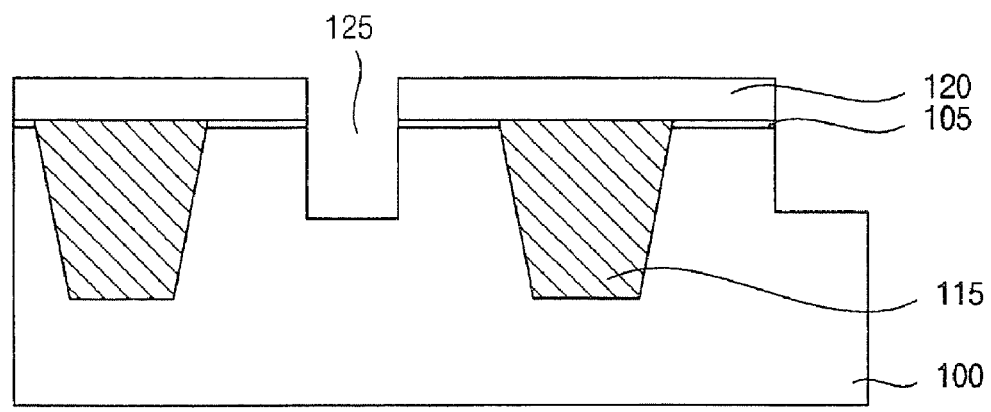
Figure 3B:
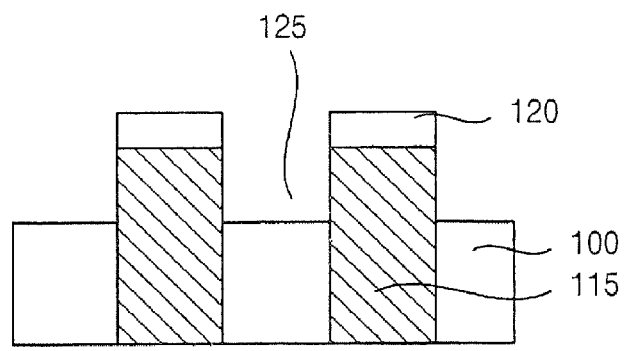

Referring to FIGS. 3A and 3B, a multilayer-structured material layer (not shown) may be formed on the second hard mask layer as a gate mask layer. For example, the material layer may include a lower layer, a middle layer and an upper layer that are sequentially stacked on the second hard mask layer. The lower layer may include an oxide layer that is formed on the second hard mask layer to a thickness of about 2,000 Å to about 3,000 Å by a plasma CVD process. The middle layer may include an organic material layer such as an amorphous carbon layer having a thickness of about 2,000 Å to about 3,000 Å, and the upper layer may include an antireflective layer such as a nitride layer having a thickness of about 500 Å. Then, the gate mask layer may be formed into a gate mask pattern on the second hard mask layer 120, and then the second mask layer 120 may be patterned into a second mask pattern by an etching process using the gate mask pattern as an etching mask. Then, the gate mask pattern may be removed from the substrate 100 and the active region of the substrate 100 may be partially etched off by an etching process using the second mask pattern as an etching mask, to thereby form a recessed portion 125 at the active region of the substrate 100.

The recessed portion 125 may provide a space for a gate electrode of the RCAT structure of the present invention. In some cases, a lower portion of the recessed portion 125 may be formed into a round shape such as a hemisphere or a various curved shape to thereby enlarge a surface area of the recessed portion 125. However, any further descriptions on the process for forming the round shape of the lower portion of the recessed portion 125 may be omitted in the present example embodiment so as to focus on the bridge-shaped inner spacer of the gate electrode, which will be disclosed in the next embodiment.

In an example embodiment, a thermal oxide layer (not shown) may be further formed on an inner sidewall of the recessed portion 125 of the substrate 100 in view of the subsequent process and etching selectivity of the substrate 100. The thermal oxide layer may protect the substrate 100 in a next deposition process for formation of a sacrificial layer 130 in FIGS. 4A and 4B and in a next etching process for removing the sacrificial layer 130 from the substrate 100.

Figure 4A:
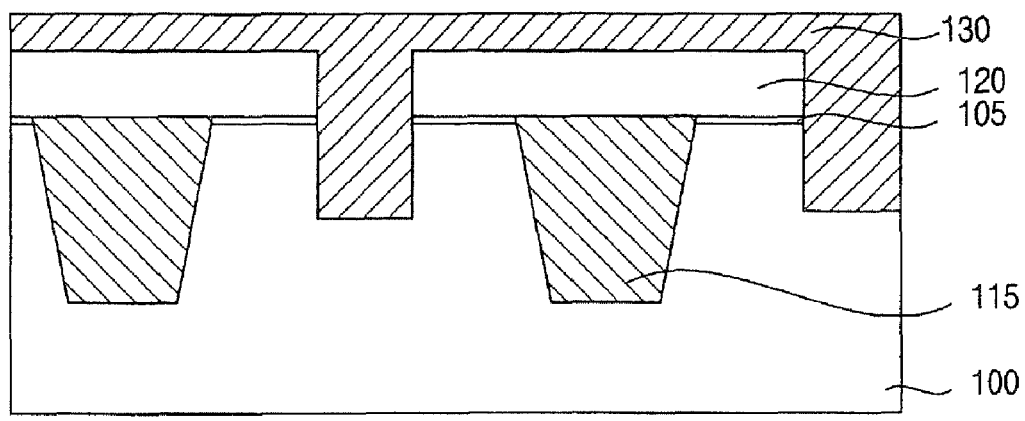
Figure 4B:
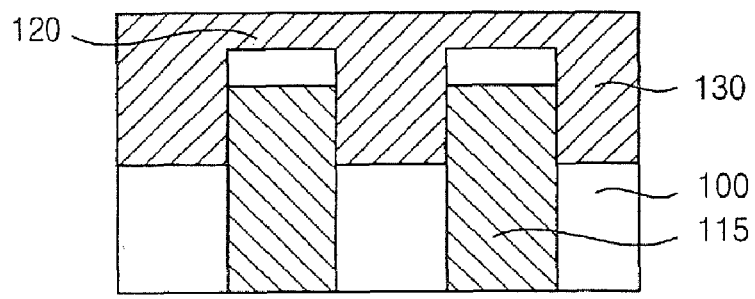

Referring to FIGS. 4A and 4B, the sacrificial layer 130 may be formed on the second hard mask pattern to a sufficient thickness to fill up the recessed portion 125 of the substrate 100. In an example embodiment, the sacrificial layer 130 may comprise silicon germanium (SiGe) having a good etching selectivity with respect to the substrate 100 and the device isolation pattern 115 comprising a nitride.

While the above example embodiment discloses that the sacrificial layer 130 may comprise silicon germanium (SiGe), any other materials may also be used for the sacrificial layer 130 as long as the sacrificial layer 130 has a sufficient etching selectivity with respect to the substrate 100 and the device isolation pattern 115, as would be known to one of ordinary skill in the art.

Figure 5A:
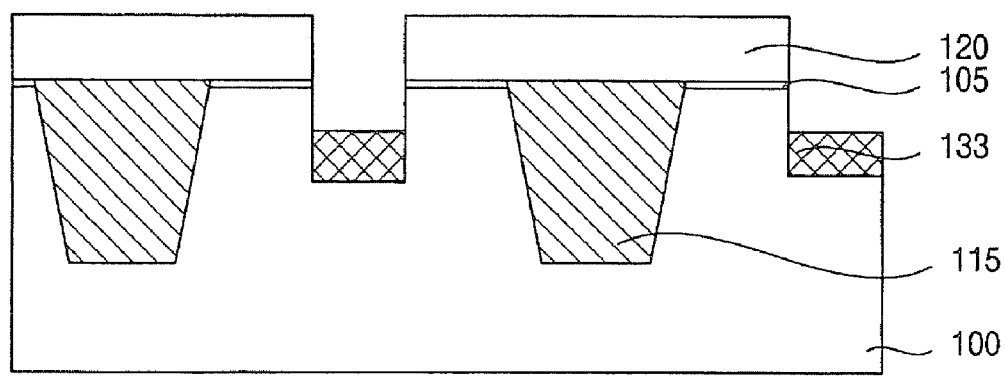
Figure 5B:
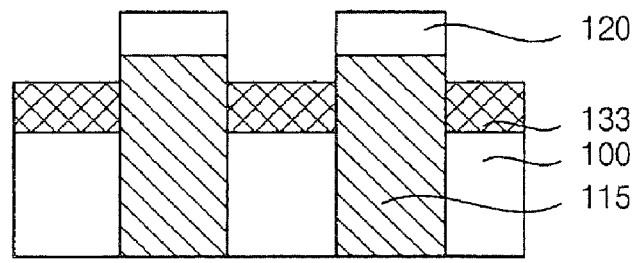

Referring to FIGS. 5A and 5B, the sacrificial layer 130 may be removed from the substrate 100 by an etch-back process in such a configuration that a residual sacrificial layer 133 may remain at a lower portion of the recessed portion 125. An inner spacer of the RCAT structure of the present inventive concept may be formed above the residual sacrificial layer 133 in a residual space of the recessed portion 125 in the recessed portion 125, and thus the thickness of the inner spacer may be determined by the thickness of the residual sacrificial layer 133. Accordingly, the sacrificial layer 130 may be removed in such a manner that the thickness of the residual sacrificial layer 133 may be sufficient for forming the inner spacer having a thickness to prevent GIDL in the RCAT structure, because the GIDL may be significantly determined by the thickness of the inner spacer in the recessed portion 125. In the present example embodiment, the residual sacrificial layer may have a thickness of about 500 Å to about 1,000 Å.

Figure 6A:
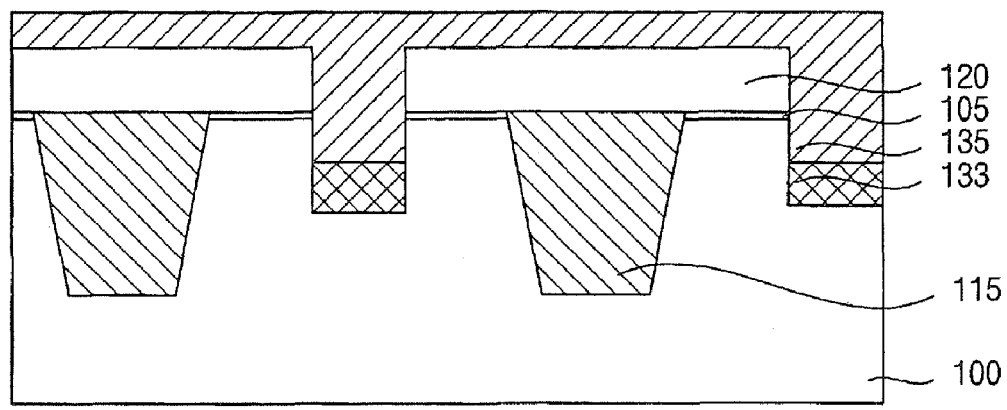
Figure 6B:
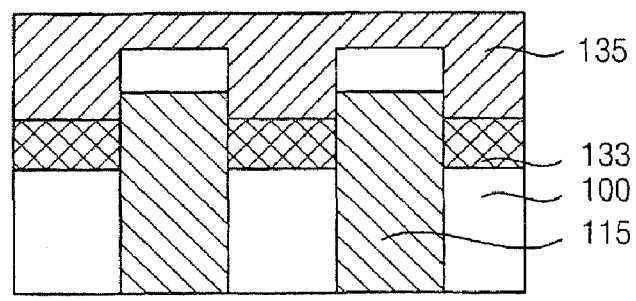

Referring to FIGS. 6A and 6B, a spacer layer 135 may be formed on the second hard mask pattern to a sufficient thickness to fill up the recessed portion, and thus the residual sacrificial layer 133 may be covered with the spacer layer 135. In an example embodiment, the spacer layer 135 may comprise a nitride and/or an oxide.

Figure 7A:
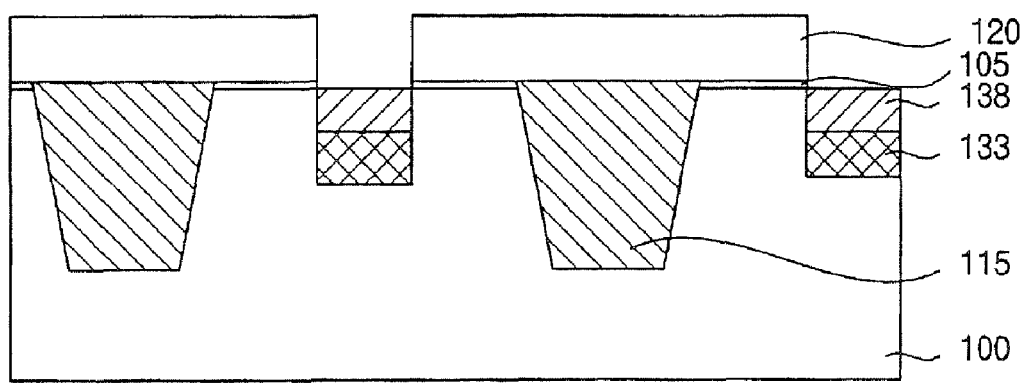
Figure 7B:
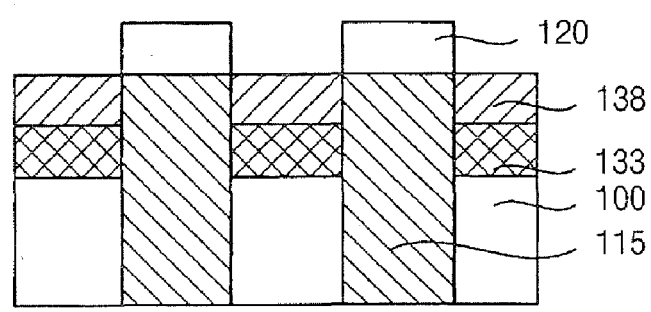

Referring to FIGS. 7A and 7B, the spacer layer 135 may be partially removed from the substrate 100 by an etch-back process, and thus only the spacer layer 135 may remain on the residual sacrificial layer 133 in the recessed portion 125. Accordingly, the residual spacer layer 138 may electrically connect source and drain regions of the active region of the substrate 100 like a bridge, and thus the residual spacer layer 138 is hereinafter referred to as bridge-shaped inner spacer 138. In the present example embodiment, a top surface of the bridge-shaped inner spacer 138 may be equal to or slightly higher than a surface of the substrate 100, thus GIDL between the drain and the gate in the RCAT may be sufficiently reduced.

Therefore, the thickness of the residual sacrificial layer 133 may be determined in view of the position of the bridge-shaped inner spacer 138 as well as of the sufficient reduction of the GIDL. That is, the residual sacrificial layer 133 may be formed into such a sufficient thickness that a lower surface of the bridge-shaped inner spacer 138 may be below the source-drain junction of the RCAT.

Figure 8A:
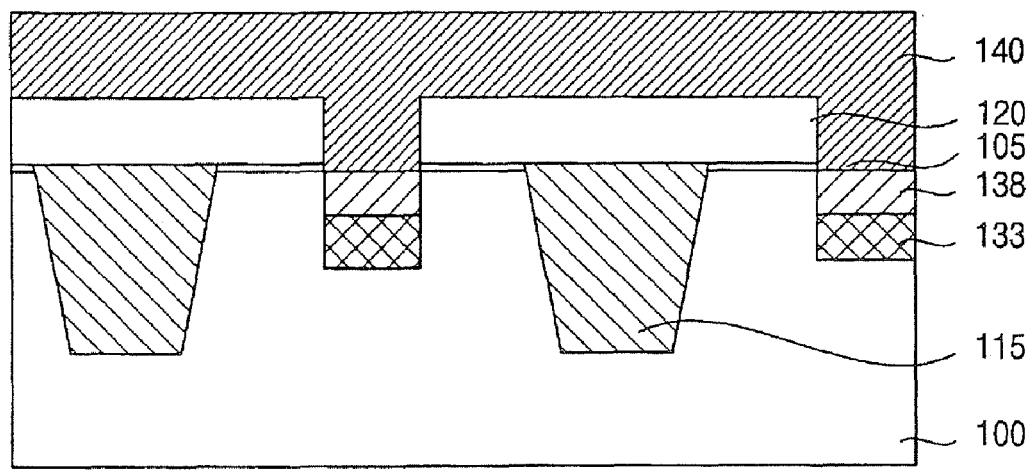
Figure 8B:
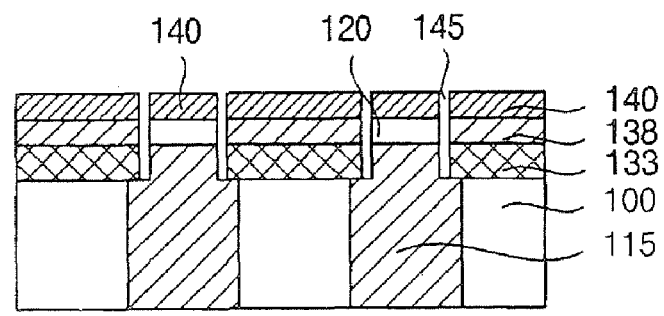

Referring to FIGS. 8A and 8B, a photoresist pattern 140 may be formed on the second hard mask pattern 120 and the bridge-shaped inner spacer 138 in such a configuration that the recessed portion 125 may be filled with the photoresist pattern 140 and the bridged-shaped spacer 138 and the second hard mask pattern 120 may be covered with the photoresist pattern 140.

Particularly, as shown in FIG. 8B, the photoresist pattern 140 may be formed in such a manner that a boundary region between the active region and the field region of the substrate 100 may be exposed through the photoresist pattern 140 in a direction of the y-axis. That is, the peripheral portions of the device isolation patterns 115 arranged in a direction of the y-axis may be exposed through the photoresist pattern 140. Then, the peripheral portions of the device isolation patterns 115 in the y-axis direction may be etched off by an etching process using the photoresist pattern 140 as an etching mask, to thereby form a connection opening 145 between the device isolation pattern 115 and a stacked structure of the residual sacrificial layer 133 and the bridge-shaped inner spacer 138. That is, the recessed portion 125 may be enlarged in the y-axis direction. Accordingly, when the residual sacrificial layer 133 in the bottom of the recessed portion 125 is removed from the substrate 100 in a subsequent etching process, the etchant for the etching process may be supplied into the recessed portion 125 through the connection opening 145. In addition, when a gate electrode of the RCAT structure is formed in the recessed portion 125, the source gases for the gate electrode may be supplied into the recessed portion 125 through the connection opening 145.

Accordingly, the connection opening 145 may be illustrated in FIG. 8B that is a cross-sectional view cut along the y-axis direction, while not being illustrated in FIG. 8A that is a cross-sectional view cut along the x-axis direction.

Figure 9A:
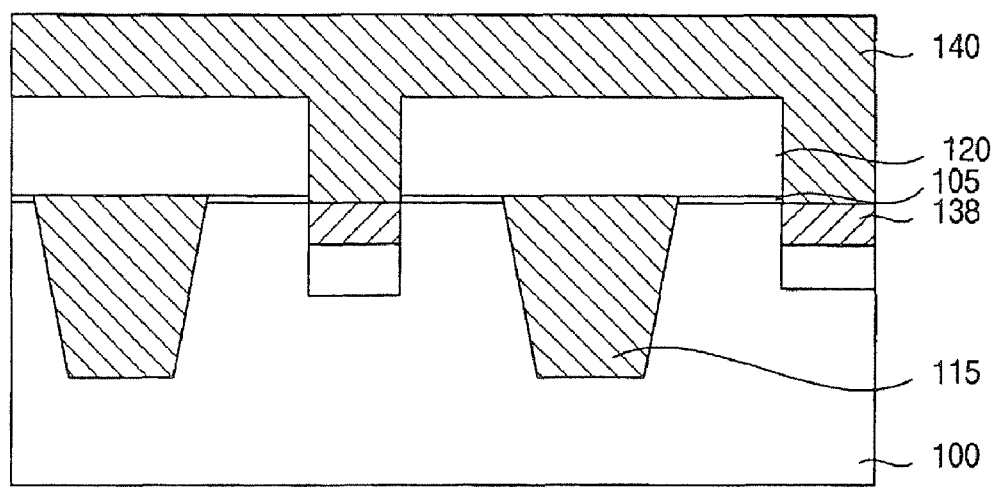
Figure 9B:
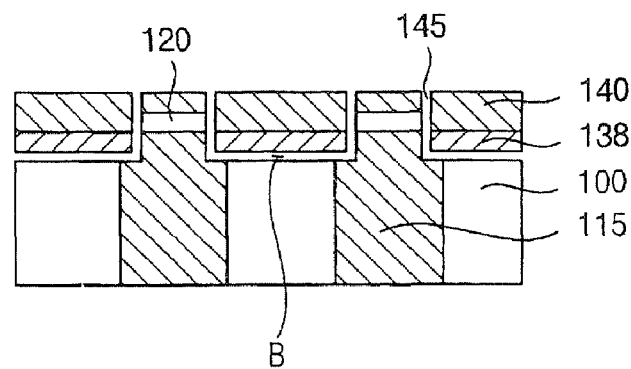

Referring to FIGS. 9A and 9B, an etchant for a wet etching process may be supplied into the recessed portion 125 of the substrate 100 through the connection opening 145 (not shown in FIG. 9A). Examples of the etchant may include a nanotip array imaging sensor (NAIS) etchant. Accordingly, only the residual sacrificial layer 133, which may comprise silicon germanium (SiGe), may be etched off from the recessed portion 125 of the substrate 100 without any etching against the substrate 100 comprising silicon (Si) and against a nitride layer and an oxide layer, and thus a bottom space B may be formed at a lower portion of the recessed portion 125 of the substrate 100. That is, the bottom space B may be defined as a space between the bridge-shaped inner spacer 138 and the bottom of the recessed portion 125.

When the residual sacrificial layer 133 may be sufficiently removed from the recessed portion 133, the residual spacer layer 138 may make contact with the inner sidewall of the recessed portion 125 in the x-axis direction and may be spaced apart from the device isolation pattern 115 by the connection opening 145 in a direction of the y-axis. Therefore, the residual spacer layer 138 may be spaced apart from the bottom of the recessed portion 125 and from the device isolation pattern 115 in the y-axis direction while making contact with the inner sidewall of the recessed portion 125 in the x-axis direction, and thus the residual spacer layer 138 may be formed into a bridge connecting both of the inner sidewalls of the recessed portion 125 opposite to each other in the x-axis direction. For that reason, the residual spacer layer 138 may be often referred to as the bridge-shaped inner spacer 138.

Figure 10A:
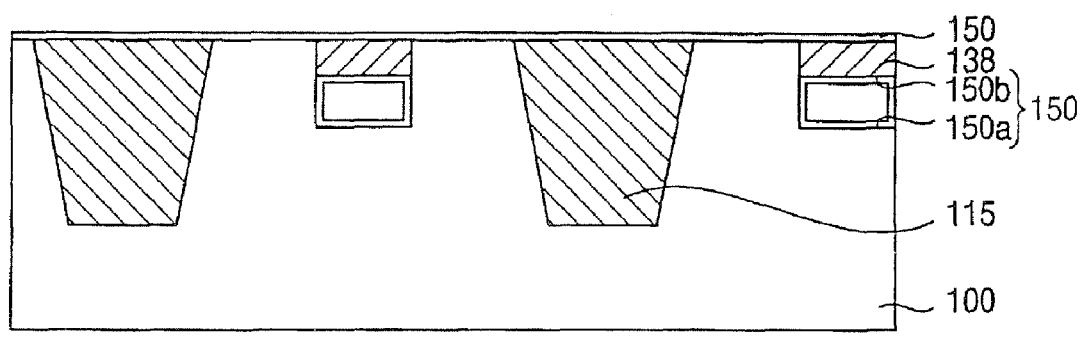
Figure 10B:
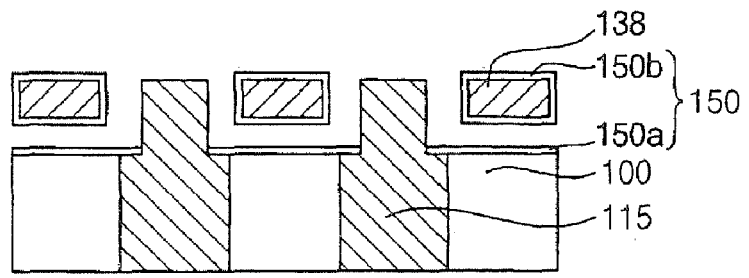

Referring to FIGS. 10A and 10B, the photoresist pattern 140 and the second hard mask pattern 120 may be removed from the substrate 100 and a cleaning process may be performed on the substrate 100 to thereby remove contaminants caused by the removal of the photoresist pattern 140 and the second hard mask pattern 120. Then, a gate insulation layer 150 may be formed on the substrate 100 and the bridge-shaped inner spacer 138. Particularly, the gate insulation layer 150 may be formed on surfaces of the bridge-shaped inner spacer 138, the bottom of the recessed portion 125 and the inner sidewalls of the recessed portion 125 connected to each other by the bridge-shaped inner spacer 138. Accordingly, the bridge-shaped inner spacer 138 may be enclosed by the gate insulation layer 150 and the inner sidewalls of the recessed portion 125 may also be covered with the gate insulation layer 150.

In an example embodiment, the gate insulation layer 150 may include a first layer 150a on the bottom of the recessed portion 125 and a second layer 150b on the surfaces of the bridge-shaped inner spacer 138 and the inner sidewalls of the recessed portion 125. In the present example embodiment, the thickness of the first layer 150a may be slightly greater than that of the second layer 150b.

In an example embodiment, the gate insulation layer 150 may include a single layer comprising one of silicon oxide (SiO2), hafnium oxide (HfO2), tantalum oxide (Ta2O5) and a multilayer structure such as an ONO (oxide/nitride/oxide) layer.

Figure 11A:
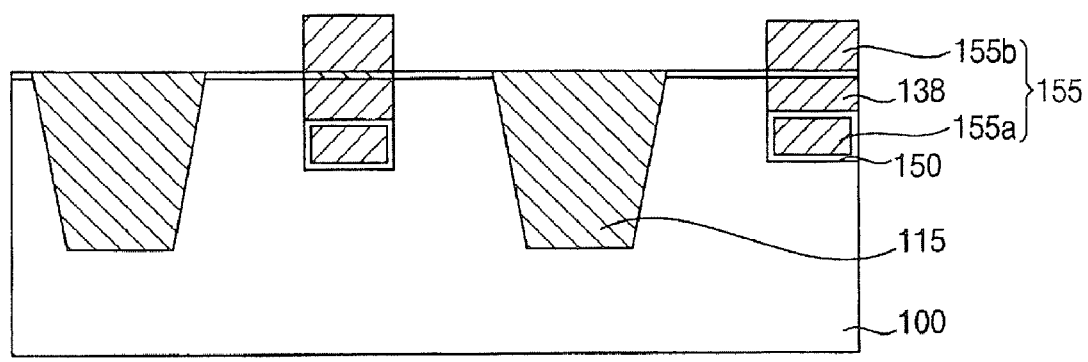
Figure 11B:
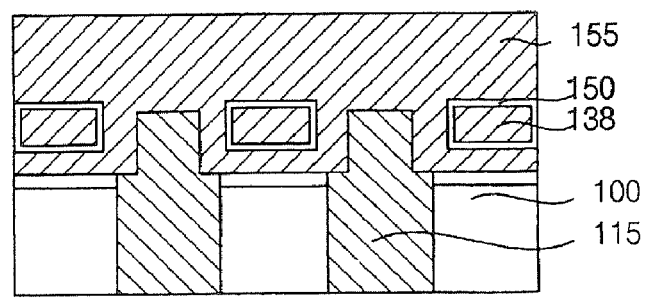

Referring to FIGS. 11A and 11B, a gate conductive layer (not shown) may be formed on the substrate 100 including the gate insulation layer 150. Particularly, a conductive material for the gate conductive layer 155 may be deposited into the bottom space B of the recessed portion 125 through the connection opening 145 as well as onto the substrate 100. Then, the gate conductive layer may be patterned into a gate line 155 that includes at least one gate electrode at each of the active region of the substrate 100 and extends along the y-axis direction on the substrate 100. In an example embodiment, the gate electrode on each active region may include a lower electrode 155a positioned in the bottom space B of the recessed portion 125 and an upper electrode 155b positioned on the bridge-shaped inner spacer 138. The lower electrode 155a and the upper electrode 155b may be connected to each other through the connection opening 145. In the present example embodiment, the lower electrode 155a and the upper electrode 155b may be integrally formed into one body.

Accordingly, the bridge-shaped inner spacer 138 may be enclosed by the gate conductive layer in the recessed portion 125.

While the above example embodiment discloses that the upper electrode 155b may include a single conductive layer, any other modified electrode known to one of ordinary skill in the art may also be utilized in place of or in conjunction with the single conductive layer 155b. For example, a metal silicide layer may be utilized for forming the upper electrode 155b. The gate conductive layer 155 may be formed on the substrate 100 such that the bottom space B and the connection opening 145 may be sufficiently filled with the gate conductive layer 155 and then an upper portion of the gate conductive layer 155 may be planarized until a top surface of the bridge-shaped inner spacer 138 is exposed. Then, a multilayer in which a polysilicon layer and a metal silicide layer may be sequentially stacked may be formed on the substrate 100, and then the multilayer structure may be patterned into the upper electrode 155b.

FIG. 11B shows that the connection opening 146 may also be filled with the gate conductive layer 155, and thus the lower electrode 155a and the upper electrode 155b may be formed into one body through the connection opening 145. In addition, adjacent upper electrodes 155b neighboring in the y-axis direction may be connected to each other, to thereby form the gate line 155 extending in the y-axis direction. In an exemplary embodiment, the gate line 155 may function as a word line (WL) in a memory device. In addition, the bridge-shaped inner spacer 138 may be positioned in an inside of the gate line 155.

Figure 12A:
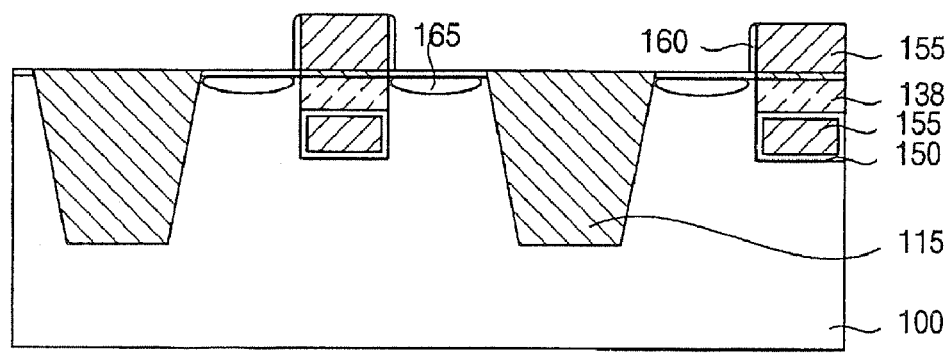
Figure 12B:
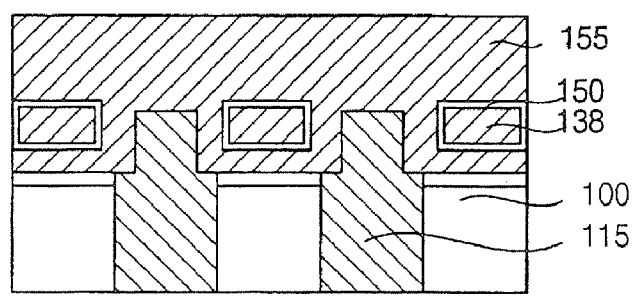

Referring to FIGS. 12A and 12B, impurities may be lightly implanted onto the substrate 100 by an implantation process using the upper electrode 155b as an implantation mask, to thereby form a lightly doped region at surface portions of the active region of the substrate 100. Then, a spacer 160 may be formed on a sidewall of the upper electrode 155b. Impurities may also be heavily implanted onto the substrate 100 by an implantation process using the space 160 as an implantation mask, to thereby form a heavily doped region at surface portions of the active region of the substrate 100. As a result, source/drain impurity regions 165 may be formed on the active region of the substrate 100.

Accordingly, the source and the drain regions may be formed at surface portions of the substrate 100 symmetrical to the gate electrode and peripheral portions of the source and drain regions may make contact with the bridge-shaped inner spacer 138 under the upper electrode 155b, and thus the source and drain regions may be electrically separated from each other to a sufficient degree by the bridge-shaped inner spacer 138. The lower electrode 155 a may be formed at the bottom space of the recessed portion 125 of the substrate 100 and the upper electrode 155b and the lower electrode 155a may be integrally formed into the gate electrode 155 in one body through the connection opening 145. That is, the bridge-shaped inner spacer 138 may be interposed between the upper electrode 155b and the lower electrode 155a of the gate electrode 155, to thereby sufficiently reduce GIDL at the gate electrode.

As compared with the inner spacer of a conventional RCAT structure, which is formed on an upper inner sidewall of a recessed portion of a substrate, the bridge-shaped inner spacer may occupy some spaces in the recessed portion of the substrate, and thus the GIDL may be sufficiently reduced in the RCAT structure of the present invention, to thereby significantly improve the operational reliability of the RCAT structure in spite of the downsizing of a minimum feature size of a device.

Method of Forming an RCAT Structure II

FIGS. 13A to 20C are cross-sectional views illustrating processing steps for a method of forming an RCAT structure for a semiconductor device in accordance with another example embodiment of the inventive concept. Particularly, the RCAT structure of the present example embodiment may include a spherical RCAT (SRCAT) structure.

The formation processes of the RCAT structure of the present example embodiment may be different from those of the RCAT structure described with reference to FIGS. 1A to 12B in that the bridge-shaped inner spacer may be directly formed on a surface of the lower electrode in place of on a surface of the sacrificial layer.

In FIGS. 13A to 20C, a figure having the suffix letter A illustrates a cross-sectional view cut along a first line of the RCAT structure, for example, the x-axis of a rectangular coordinate system and a figure having the suffix letter C illustrates a cross-sectional view cut along a second line of the RCAT structure perpendicular to the first line, for example, the y-axis of the rectangular coordinate system. In a case where the RCAT structure is used in a memory device, the x-axis may be parallel with a bit line of the memory device and the y-axis may be parallel with a word line of the memory device. Particularly, while the suffix letter A indicates a cross-sectional view of an RCAT structure cut along the x-axis direction, the suffix letter B indicates a cross-sectional view of a SRCAT structure cut along the x-axis direction.

The cross-sectional views of the RCAT and the SRCAT structures cut along the word line (WL) direction are substantially the same, and thus no individual cross-sectional views cut along the word line (WL) are respectively needed for the RCAT and the SRCAT structures and each of the views designated by the suffix letter C indicates the cross-sectional view cut along the word line (WL) of both of the RCAT and the SRCAT structures. Further, a structural element of the RCAT structure or the SRCAT structure that may only be illustrated in one of the x-axis directional and the y-axis directional cross-sectional views will be described much more in detail, and a structural element of the RCAT structure or the SRCAT structure that may be illustrated in both of the x-axis directional and the y-axis directional cross-sectional views will be briefly described hereinafter.

In addition, the RCAT structure and the SRCAT structure may have substantially the same structure, except that a bottom of the recessed portion may be formed into round in the SRCAT structure, and thus the processing steps for forming the RCAT and the SRCAT structures will be described in detail with reference to a view designated by the suffix letter A while descriptions with reference to a view designated by the suffix letter B will be omitted. However, the processing steps for forming the recessed portion may be fully described with reference to both of the views designated by the suffix letter A and B, respectively.

Figure 13A:
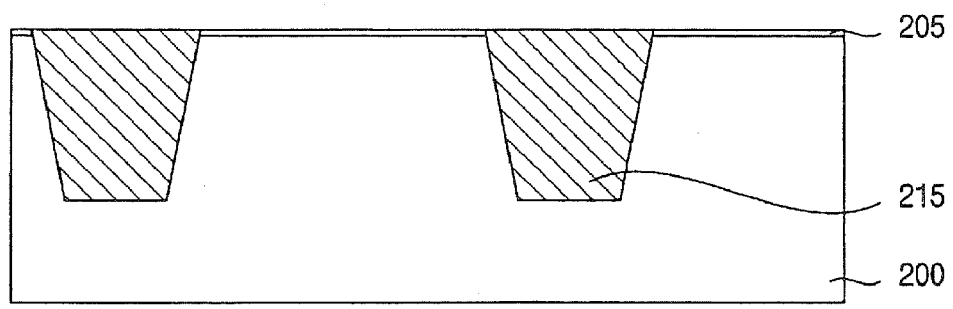
FIGS. 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B and 20C are cross-sectional views illustrating processing steps for a method of forming an RCAT structure for a semiconductor device in accordance with another example embodiment of the inventive concept.
Figure 13B:
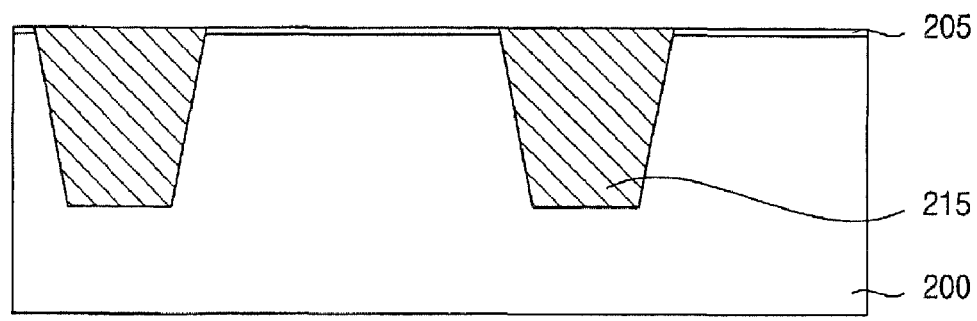
Figure 13C:
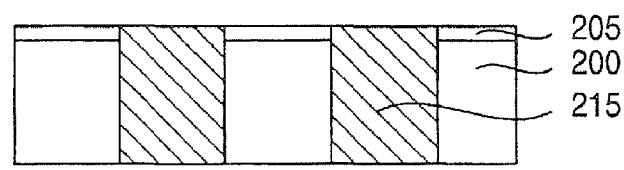

Referring to FIGS. 13A, 13B and 13C, a pad oxide layer (not shown) may be formed on a substrate 200 such as a semiconductor wafer to a thickness of about 50 Å to about 150 Å by an oxidation process such as a thermal oxidation process. The pad oxide layer may be formed into a pad oxide pattern 205 by a subsequent patterning process.

A first hard mask layer (not shown) may be formed on the pad oxide layer. The first hard mask layer may comprise a material having an etching selectivity with respect to the substrate 100 and the pad oxide layer. Examples of the material for the first hard mask layer may include silicon nitride.

The first hard mask layer may be formed into a first hard mask pattern (not shown) by a subsequent patterning process. The pad oxide pattern 205 and the first hard mask pattern may be formed on the substrate 200 simultaneously or individually by the same patterning process or a respective patterning process. The substrate 200 may be partially etched off by an etching process using the first hard mask pattern as an etching mask, to thereby form a trench on the substrate 200. Then, an insulation material may be filled into the trench, and thus an insulation pattern 215 may be formed along the trench on the substrate 200. Adjacent conductive structures on the substrate 200 may be electrically isolated from each other by the insulation pattern in the trench, and thus the insulation pattern 215 may be referred to as device isolation pattern hereinafter. That is, the substrate 200 may be divided into an active region and a field region by the device isolation pattern 215.

Figure 14A:
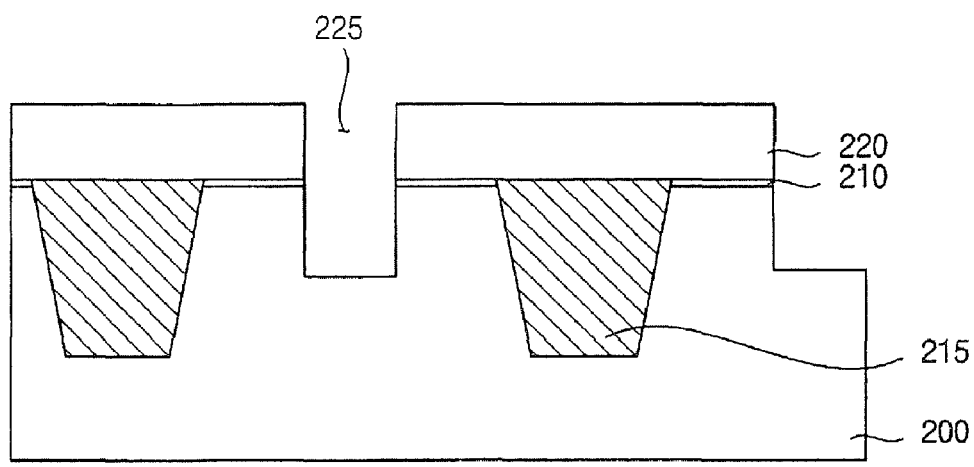
Figure 14B:
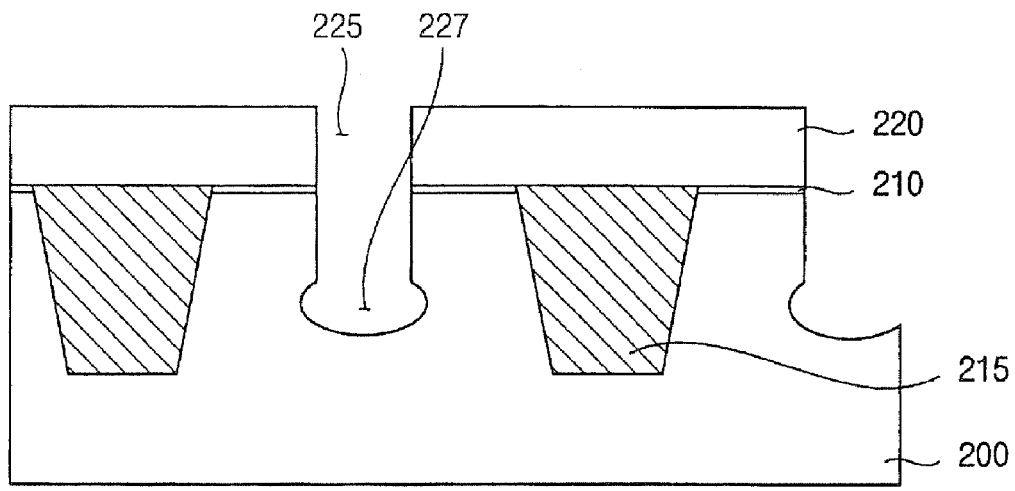
Figure 14C:
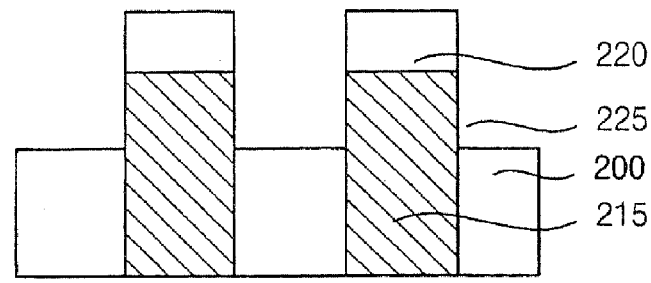

Referring to FIG. 14A to 14C, the first hard mask pattern may be removed from the substrate 200 and an upper portion of the device isolation pattern 215 may be planarized by a planarization process in such a manner that a top surface of the device isolation pattern 215 may be coplanar with the surface of the pad oxide pattern 205. Then, a second hard mask layer (not shown) may be formed on the device isolation pattern 215 and the buffer oxide pattern 210. In the present example embodiment, the second mask layer may comprise the same material as the first hard mask layer. As a modification of the present processing step, the pad oxide pattern 205 may be removed from the substrate 200 before the formation of the second hard mask layer and then a buffer oxide pattern 210 may be formed on the active region of the substrate 200 by the same process as the pad oxide pattern 205, as shown in FIG. 14A.

Although not shown in FIGS. 14A to 14C, a multilayer-structured material layer (not shown) may be formed on the second hard mask layer as a gate mask layer. For example, the material layer may include a lower layer, a middle layer and an upper layer that are sequentially stacked on the second hard mask layer. The lower layer may include an oxide layer that is formed on the second hard mask layer to a thickness of about 2,000 Å to about 3,000 Å by a plasma CVD process. The middle layer may include an organic material layer such as an amorphous carbon layer having a thickness of about 2,000 Å to about 3,000 Å, and the upper layer may include an anti-reflective layer such as a nitride layer having a thickness of about 500 Å. Then, the gate mask layer may be formed into a gate mask pattern on the second hard mask layer, and then the second mask layer may be patterned into a second hard mask pattern 220 by an etching process using the gate mask pattern as an etching mask. The gate mask pattern may be removed from the substrate 200 and the active region of the substrate 200 may be partially etched off by an etching process using the second mask pattern 220 as an etching mask, to thereby form a recessed portion 225 at the active region of the substrate 200.

In an example embodiment, a nitride layer (not shown) may be formed on an inner sidewall and a bottom of the recessed portion 225 of the substrate 200 to a thickness of about 200 Å, and then the nitride layer on the bottom of the recessed portion 225 may be removed from the substrate 200 by an etch-back process. Thus, the nitride layer may only remain on the inner sidewall of the recessed portion 225 of the substrate 200. The nitride layer may function as etch-protect layer in the recessed portion 225 in a subsequent etching process for forming a round bottom of the recessed portion 225.

Thereafter, an isotropic etching process may be performed in the recessed portion 225 of the substrate 200, and thus the bottom of the recessed portion may be isotropically etched off, to thereby form a round bottom 227 of the recessed portion 225. That is, the bottom of the recessed portion 225 may be enlarged by the isotropic etching process and the recessed portion 225 may have a larger bottom space at a bottom thereof. While performing the isotropic etching process against the bottom of the recessed portion 225, the inner sidewall of the recessed portion 225 may be protected from the etching process by the nitride layer. Then, the etch-protection layer may be removed from the recessed portion 225.

Accordingly, the recessed portion 225 may have the round bottom 227, for example, shaped into a hemisphere or a hemi-cylinder.

Figure 15A:
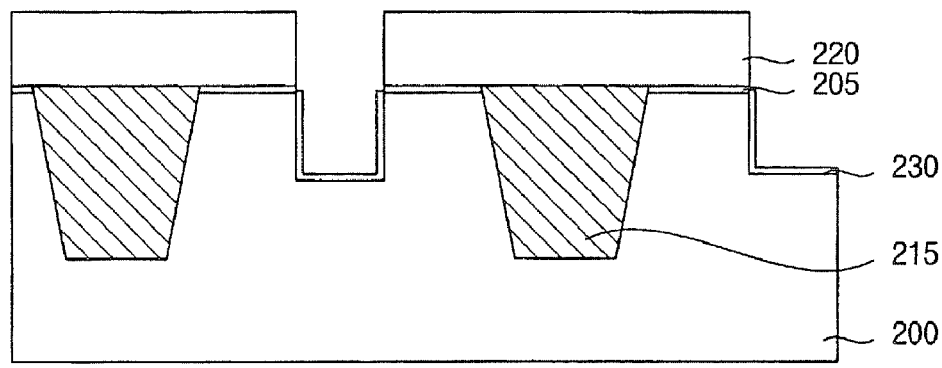
Figure 15B:
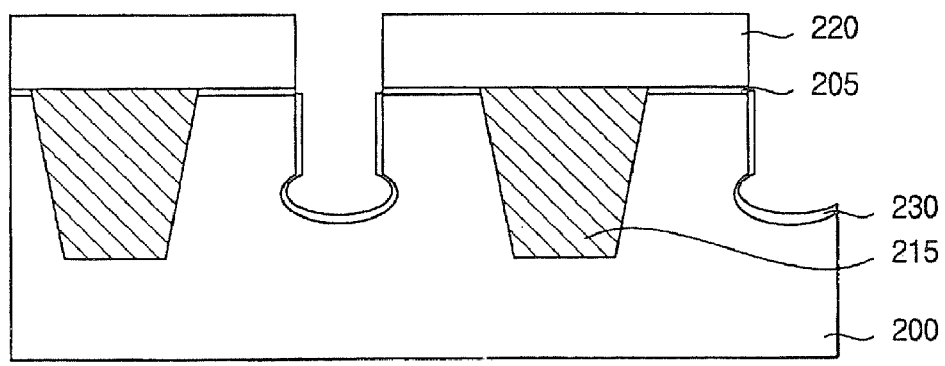
Figure 15C:
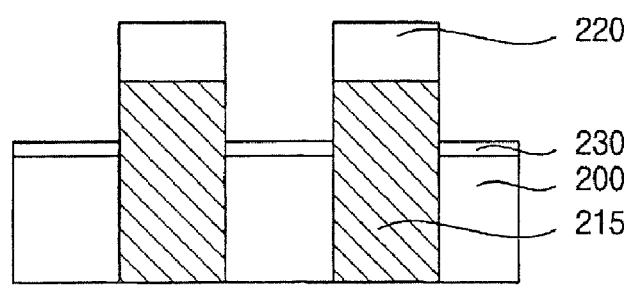

Referring to FIGS. 15A to 15C, a gate insulation layer 230 may be formed on the inner sidewall and the bottom (or the round bottom 227) of the recessed portion 225 in a subsequent process. In an example embodiment, the gate insulation layer 230 may include a single layer comprising one of silicon oxide (SiO2), hafnium oxide (HfO2), tantalum oxide (Ta2O5) and a multilayer structure such as an ONO (oxide/nitride/oxide) layer.

Figure 16A:
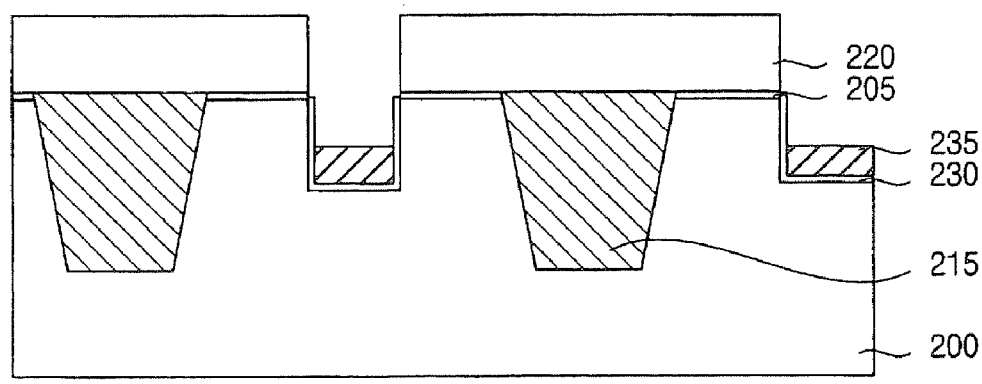
Figure 16B:
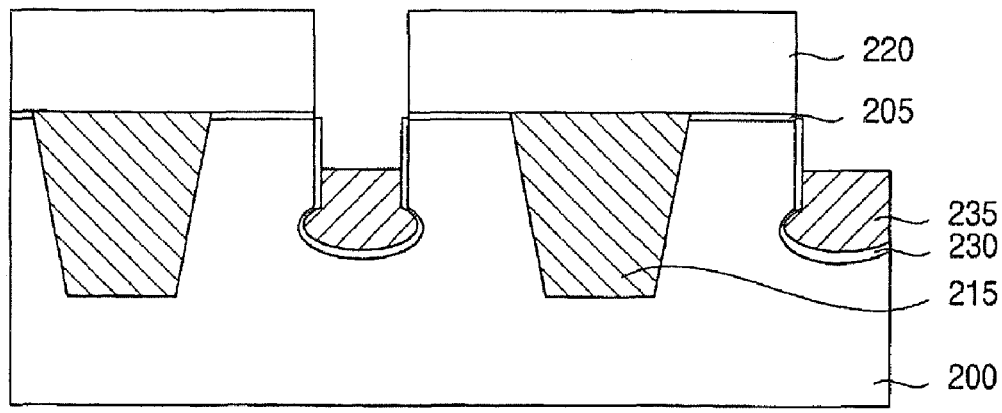
Figure 16C:
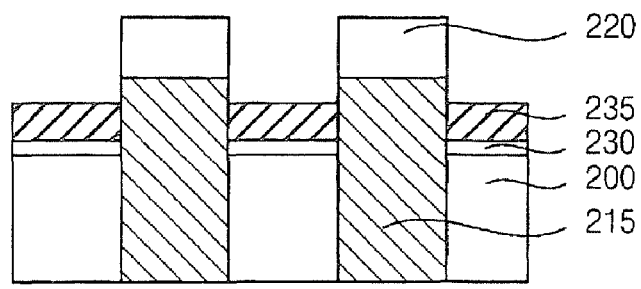

Referring to FIGS. 16A to 16C, a lower electrode layer (not shown) may be formed on the second hard mask pattern 220 to a sufficient thickness to fill up the recessed portion 225 of the substrate 200. For example, the lower electrode layer may comprise polysilicon. Then, the lower electrode layer may be partially removed from the substrate 200 by an etch-back process, and thus only remain at the lower portion of the recessed portion 225. That is, a lower electrode 235 of the RCAT/SRCAT structure may be formed at the lower portion of the recessed portion 225. A residual portion of the recessed portion 225 excluding the lower portion may provide a space in which a bridge-shaped inner spacer of the present inventive concept may be positioned, and thus the thickness of the bridge-shaped inner spacer may be determined by the thickness of the lower electrode 235. Accordingly, the lower electrode 235 may be formed to such a sufficient thickness that the bridge-shaped inner spacer may have a sufficient thickness to prevent GIDL in the RCAT structure in the residual space of the recessed portion 225, because the GIDL may be significantly determined by the thickness of the bridge-shaped inner spacer in the recessed portion 225. In the present example embodiment, the lower electrode 235 may have a thickness of about 500 Å to about 1,000 Å.

Particularly, in the case of the SRCAT structure, the round bottom 227 of the recessed portion 225 may be much larger than an upper portion of the recessed portion 225, and thus a void may be generated between the lower electrode 235 and round bottom 227 of the recessed portion 225. For that reason, the lower electrode 235 may be formed into a double-layer structure in view of a flow degree of a layer. For example, a heavily doped polysilicon layer may be firstly formed on the round bottom 227 of the recessed portion 225, and then a lightly doped polysilicon layer may be secondly formed on the heavily doped polysilicon layer, to thereby prevent the void between the lower electrode 235 and the round bottom 227 while forming the lower electrode layer 235 in the recessed portion 235 of the SRCAT structure.

Figure 17A:
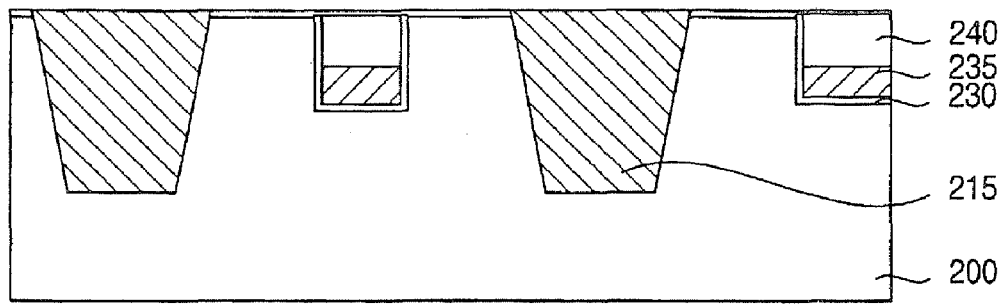
Figure 17B:
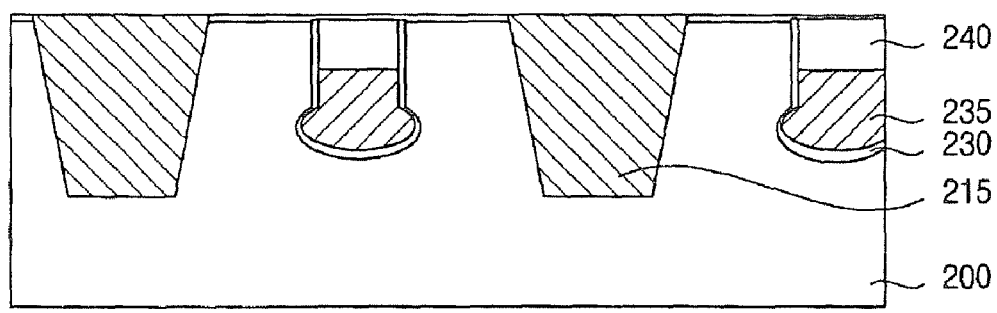
Figure 17C:
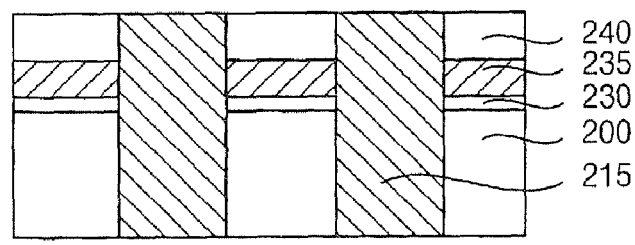

Referring to FIGS. 17A to 17C, a spacer layer (not shown) may be formed on the second hard mask pattern 220 to a sufficient thickness to fill up the residual portion of the recessed portion 225, and then the spacer layer and the second hard mask pattern 220 may be planarized until a surface of the buffer oxide layer 210 may be exposed. Therefore, the spacer layer may only remain in the residual portion of the recessed portion 225 of the substrate 200, to thereby form a bridge-shaped inner spacer 240 on the lower electrode 235. That is, the gate insulation layer 230, the lower electrode 235 and the bridge-shaped inner spacer 240 may be sequentially stacked in the recessed portion 225 of the substrate 200.

Figure 18A:
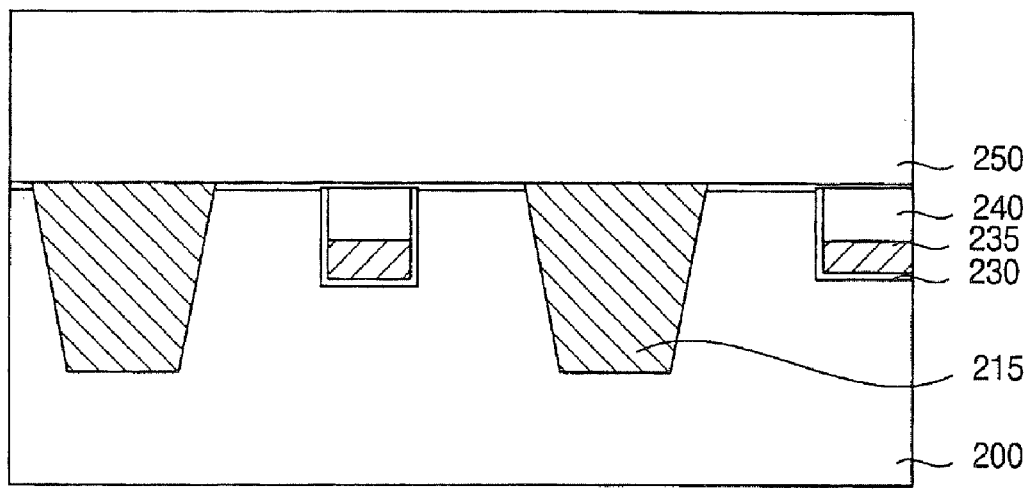
Figure 18B:
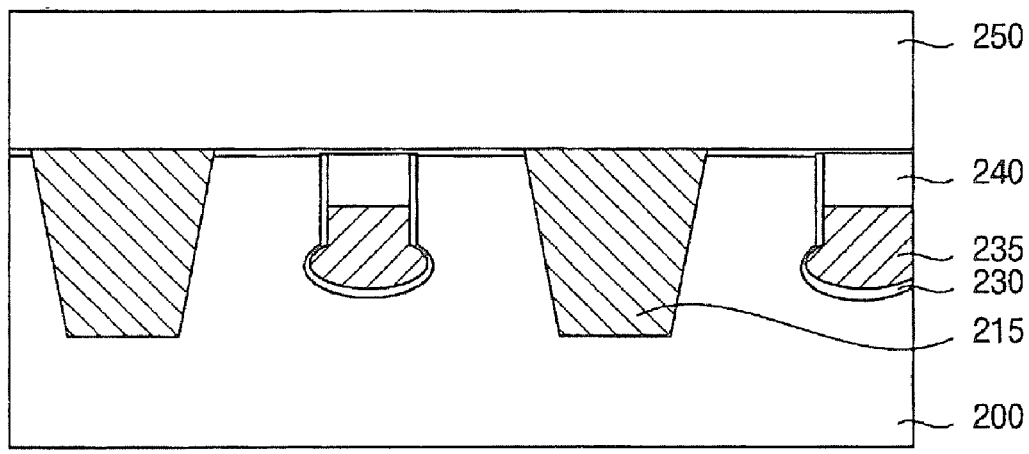
Figure 18C:
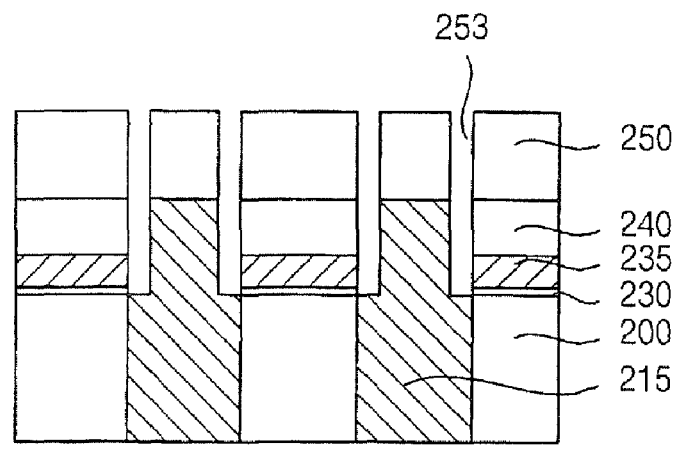

Referring to FIGS. 18A to 18C, a photoresist pattern 250 may be formed on the substrate 200 in such a manner that a boundary region between the active region and the field region of the substrate 200 may be exposed through the photoresist pattern 250 in a direction of the y-axis and the active region and the field region may be sufficiently covered with the photoresist pattern 250 in the x-axis direction. That is, the peripheral portions of the device isolation patterns 215 arranged in a direction of the y-axis may be exposed through the photoresist pattern 250. Then, the peripheral portions of the device isolation patterns 215 in the y-axis direction may be etched off by an etching process using the photoresist pattern 250 as an etching mask, to thereby form a connection opening 253 between the device isolation pattern 215 and a stacked structure of the lower electrode 235 and the bridge-shaped inner spacer 240, as shown in FIG. 18C. That is, the recessed portion 225 may be enlarged in the y-axis direction by the removal of the peripheral portions of the device isolation pattern 215. In a subsequent process, a connection electrode that may electrically connect the lower electrode 235 to an upper electrode (which will be described hereinafter) may be formed in the connection opening 253. The etching process for forming the connection opening 253 may cause damage to the gate insulation layer 230, and thus a thermal treatment may be additionally performed on the substrate 200 so as to cure the gate insulation layer 230 in the recessed portion 225.

Figure 19A:
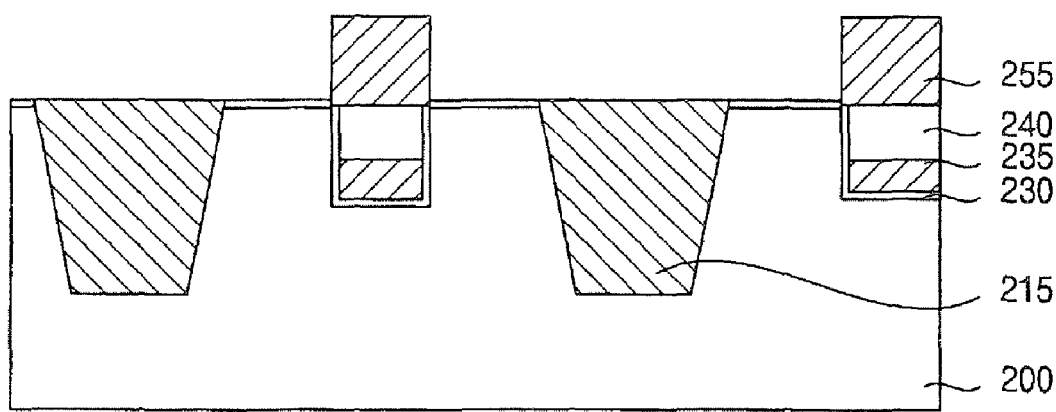
Figure 19B:
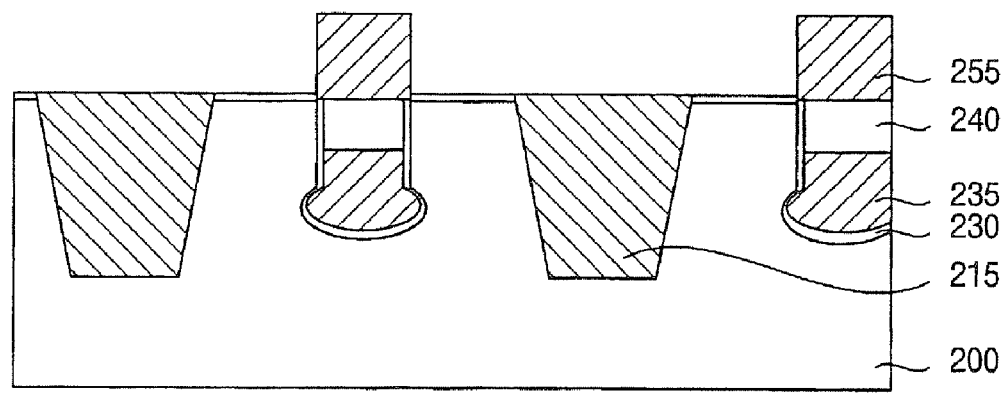
Figure 19C:
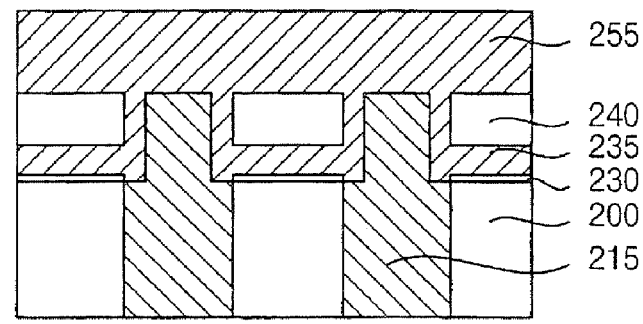

Referring to FIGS. 19A to 19C, an upper electrode 255 may be formed on the bridge-shaped inner spacer 240. In the present example embodiment, the upper electrode 255 may be connected to the lower electrode 235 via the connection electrode (not shown) through the connection opening 253 between the active region and the field region.

In an example embodiment, an upper surface of the bridge-shaped inner spacer 240 may make contact with the upper electrode 255 and a lower surface of the bridge-shaped inner spacer 240 may make contact with the lower electrode 235. First side surfaces of the bridge-shaped inner spacer 240, which may be normal to the x-axis, may make contact with the inner sidewalls of the recessed portion 225 through the medium of the gate insulation layer 230 and second side surfaces of the bridge-shaped inner spacer 240, which may be normal to the y-axis, may make contact with the connection electrode. Therefore, the bridge-shaped inner spacer 240 may be enclosed by the lower and upper electrodes 235 and 255 in the recessed portion 225. When source and drain regions of the RCAT structure may be formed at surface portions of the active region around the upper electrode 255, the bridge-shaped inner spacer 240 under the upper electrode 255 may be shaped into a bridge across the source and drain regions through the medium of the gate insulation layer 230. That is, the bridge-shaped inner spacer 240 may extend under the upper electrode 255 along the x-axis direction and may make contact with the source and drain regions through the medium of the gate insulation layer 230.

While the above example embodiment discloses that the upper electrode 255 may include a single conductive layer, any other modified electrode known to one of ordinary skill in the art may also be utilized in place of or in conjunction with the single conductive layer. For example, a metal silicide layer may be utilized for forming the upper electrode 255.

In an example embodiment, the upper electrode 255 may extend into the connection opening 253, and thus make contact with the lower electrode 235, as shown in FIG. 19C. That is, the upper electrode 255 and the connection electrode may be integrally formed on the bridge-shaped inner spacer and in the connection opening in one body. The upper electrode 255 may be electrically connected to the lower electrode 235 through the connection electrode, to thereby form a gate electrode of the RCAT/SRCAT structure of the present inventive concept. In addition, a plurality of the upper electrodes 255 adjacent to each other in the y-axis direction may be formed into a single conductive line in the y-axis direction, to thereby form a gate line in the RCAT structure. For example, the RCAT structure may be used in a memory device, the gate line in the y-axis direction may function as a word line (WL) of the memory device.

As described above, the bridge-shaped inner spacer 240 may direct contact with the lower electrode 235 and the connection electrode, and thus no gate insulation layer may be formed on the lower surface and the second side surfaces of the bridge-shaped inner spacer 240 unlike the RCAT structure described with reference to FIGS. 10A and 10B. In the present example embodiment, the gate insulation layer 230 may be formed prior to the processing step for forming the bridge-shaped inner spacer while FIGS. 10A and 10B illustrates that the gate insulation layer may be formed posterior to the processing step for forming the bridge-shaped inner spacer.

Figure 20A:
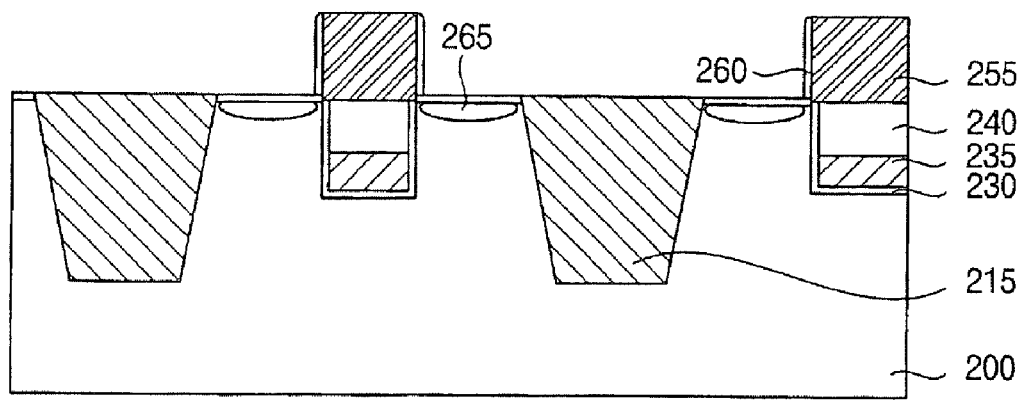
Figure 20B:
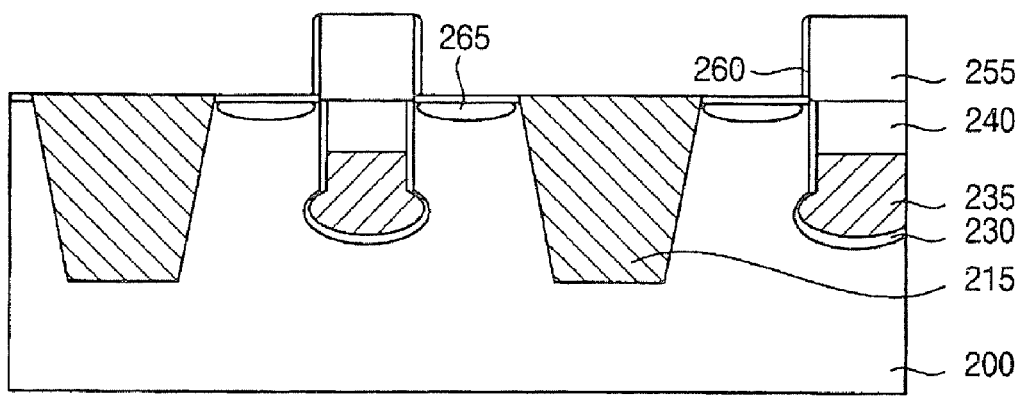
Figure 20C:
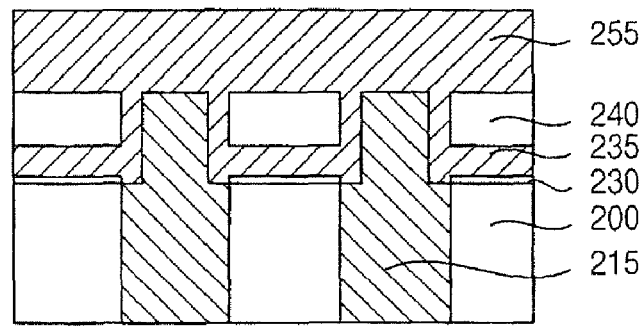

Referring to FIGS. 20A to 20C, impurities may be lightly implanted onto the substrate 200 by an implantation process using the upper electrode 255 as an implantation mask, to thereby form a lightly doped region at surface portions of the active region of the substrate 200. Then, a spacer 260 may be formed on a sidewall of the upper electrode 255. Impurities may also be heavily implanted onto the substrate 200 by an implantation process using the spacer 260 as an implantation mask, to thereby form a heavily doped region at surface portions of the active region of the substrate 200. As a result, source/drain regions 265 may be formed on the active region of the substrate 200.

Accordingly, the source and the drain regions may be formed at surface portions of the substrate 200 symmetrical to the gate electrode and peripheral portions of the source and drain regions may make contact with the bridge-shaped inner spacer 240 under the upper electrode 255, and thus the source and drain regions may be electrically separated from each other to a sufficient degree by the bridge-shaped inner spacer 240. The lower electrode 255 may be formed at the bottom portion of the recessed portion 225 of the substrate 200 and the upper electrode 255 and the lower electrode 235 may be integrally formed into the gate electrode in one body through the connection opening 253. That is, the bridge-shaped inner spacer 240 may be interposed between the upper electrode 255 and the lower electrode 235 of the gate electrode, to thereby sufficiently reduce GIDL at the gate electrode.

As compared with the inner spacer of a conventional RCAT structure, which is formed on an upper inner sidewall of a recessed portion of a substrate, the bridge-shaped inner spacer of the present inventive concept may occupy some spaces in the recessed portion of the substrate, and thus the GIDL may be sufficiently reduced in the RCAT structure of the present inventive concept, to thereby significantly improve the operational reliability of the RCAT structure in spite of the downsizing of a minimum feature size.

Semiconductor Device Having the RCAT Structure and Manufacturing Method

Figure 21:
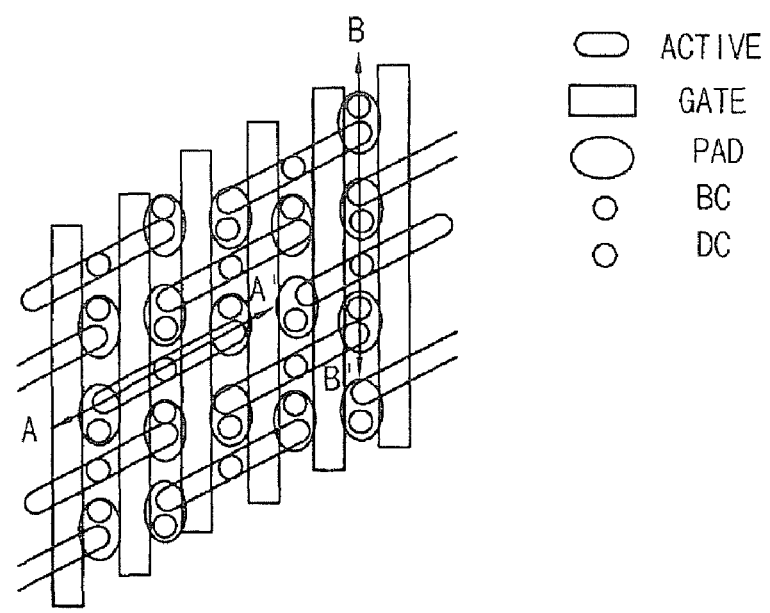
FIG. 21 is a view illustrating a layout of a semiconductor device having an RCAT structure in accordance with an example embodiment of the present inventive concept.

FIG. 21 is a view illustrating a layout of a semiconductor device having an RCAT structure in accordance with an example embodiment of the present inventive concept and FIGS. 22 to 37 are cross-sectional views illustrating a method of manufacturing a semiconductor device having an RCAT structure in accordance with an example embodiment of the present invention. In the present example embodiment, the semiconductor device having the RCAT structure may include a dynamic random access memory (DRAM) device having the SRCAT structure shown in FIGS. 20A to 20C. While the present example embodiment discloses the DRAM device and manufacturing method thereof, any other semiconductor devices known to one of ordinary skill in the art may also be manufactured by the same process as the present inventive concept as long as the semiconductor device includes the SRCAT structure. In addition, the semiconductor device having the RCAT structure shown in FIGS. 12A and 12B may also be manufactured by the same process as the present inventive concept, as would be known to one of ordinary skill in the art.

In FIG. 21, a line A-A' may be parallel with a bit line of the DRAM device and a line B-B' may be parallel with a gate line or a word line of the DRAM device. FIGS. 22 to 37 are cross-sectional views cut along the line A-A' of FIG. 21, except for FIGS. 28A and 28B. In FIGS. 28A and 28B, the suffix letter A indicates the cross-sectional view cut along the line A-A' of FIG. 21 and the suffix letter B indicates the cross-sectional view cut along the line B-B' of FIG. 21.

Figure 22:
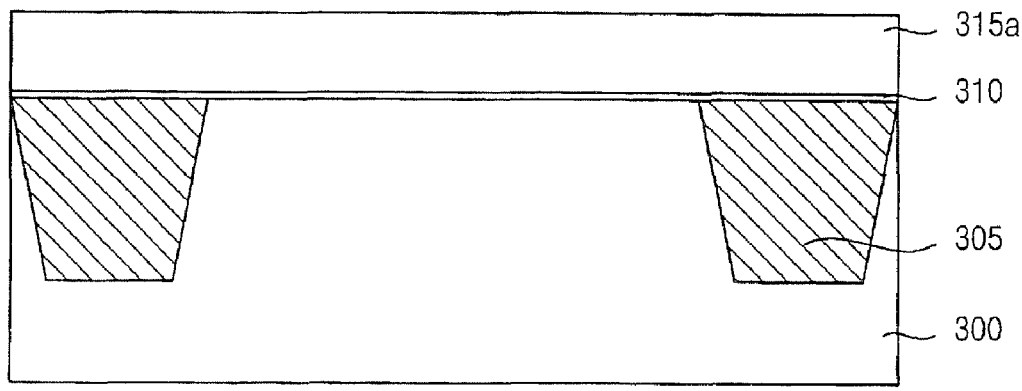
FIGS. 22, 23, 24, 25, 26, 27, 28A, 28B, 29, 30, 31, 32, 33, 34, 35, 36, and 37 are cross-sectional views illustrating a method of manufacturing a semiconductor device having an RCAT structure in accordance with an example embodiment of the present invention.

Referring to FIGS. 21 and 22, a device isolation pattern 305 may be formed on a substrate 300 such as a semiconductor wafer, and thus the substrate 300 may be divided into an active region and a field region.

In an example embodiment, a trench (not shown) may be formed on the substrate 300 by an STI process and a thermal oxide layer and a liner comprising a nitride may be formed on the inner sidewall of the trench. Then, an insulation layer may be formed on the substrate 300 to a sufficient thickness to fill up the trench by a CVD process such as an HDP-CVD process. The insulation layer may be planarized until a surface of the substrate 300 may be exposed, to thereby form the device isolation pattern 305 in the trench.

Then, a buffer oxide layer 310 may be formed on the substrate 300 to a thickness of about 50 Å to about 150 Å by a thermal oxidation process.

Then, a hard mask layer 315a may be formed on the buffer oxide layer 310. In the present example embodiment, the hard mask layer 315a may comprise a material having an etching selectivity with respect to the substrate 300 and the buffer oxide layer 310. For example, the hard mask layer 315a may comprise silicon nitride.

In an example embodiment, a multilayer-structured material layer (not shown) may be formed on the hard mask layer 315a as a gate mask layer. For example, the material layer may include a lower layer, a middle layer and an upper layer that are sequentially stacked on the hard mask layer 315a. The lower layer may include an oxide layer that is formed on the hard mask layer 315a to a thickness of about 2,000 Å to about 3,000 Å by a plasma CVD process. The middle layer may include an organic material layer such as an amorphous carbon layer having a thickness of about 2,000 Å to about 3,000 Å, and the upper layer may include an anti-reflective layer such as a nitride layer having a thickness of about 500 Å.

Figure 23:
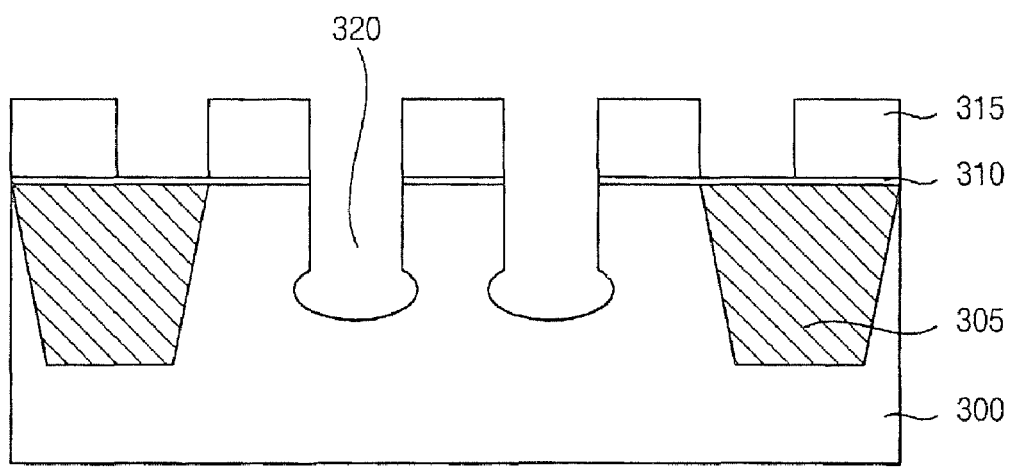

Referring to FIGS. 21 and 23, the gate mask layer may be formed into a gate mask pattern on the hard mask layer 315a, and then the mask layer 315a may be patterned into a hard mask pattern 315 by an etching process using the gate mask pattern as an etching mask. The gate mask pattern may be removed from the substrate 300 and the active region of the substrate 300 may be partially etched off by an etching process using the hard mask pattern 315 as an etching mask, to thereby form a recessed portion 320 at the active region of the substrate 300.

In an example embodiment, a nitride layer (not shown) may be formed on an inner sidewall and a bottom of the recessed portion 320 of the substrate 300 to a thickness of about 200 Å, and then the nitride layer on the bottom of the recessed portion 320 may be removed from the substrate 300 by an etch-back process. Thus, the nitride layer may only remain on the inner sidewall of the recessed portion 320. The nitride layer may function as an etch-protect layer in the recessed portion 320 in a subsequent etching process for forming an enlarged portion of the recessed portion 320.

Thereafter, an isotropic etching process may be performed in the recessed portion 320 of the substrate 300, and thus the bottom of the recessed portion 320 may be isotropically etched off, to thereby form an enlarged portion 321 of the recessed portion 320. That is, the bottom of the recessed portion 320 may be enlarged by the isotropic etching process and the recessed portion 320 may have a larger bottom space at a bottom thereof. While performing the isotropic etching process against the bottom of the recessed portion 320, the inner sidewall of the recessed portion 320 may be protected from the etching process by the nitride layer. Thereafter, the etch-protection layer may be removed from the recessed portion 320. Accordingly, the recessed portion 320 may have the enlarged portion 321 at a bottom portion thereof, for example, shaped into a hemisphere or a hemi-cylinder.

Figure 24:
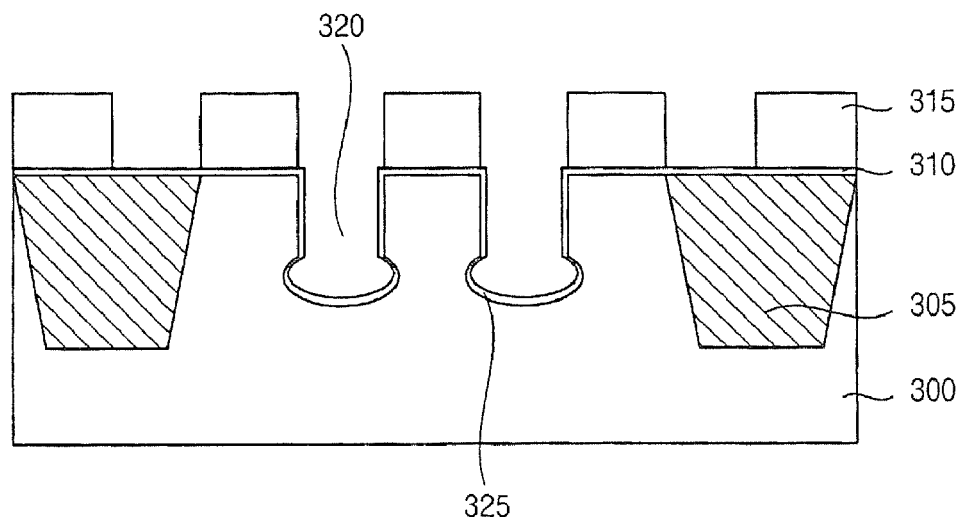

Referring to FIGS. 21 and 24, a gate insulation layer 325 may be formed on the inner sidewall and the bottom of the recessed portion 320 in a subsequent process. In an example embodiment, the gate insulation layer 325 may include a single layer comprising one of silicon oxide ($SiO_2$), hafnium oxide ($HfO_2$), tantalum oxide ($Ta_2O_5$) and a multilayer structure such as an ONO (oxide/nitride/oxide) layer.

Figure 25:
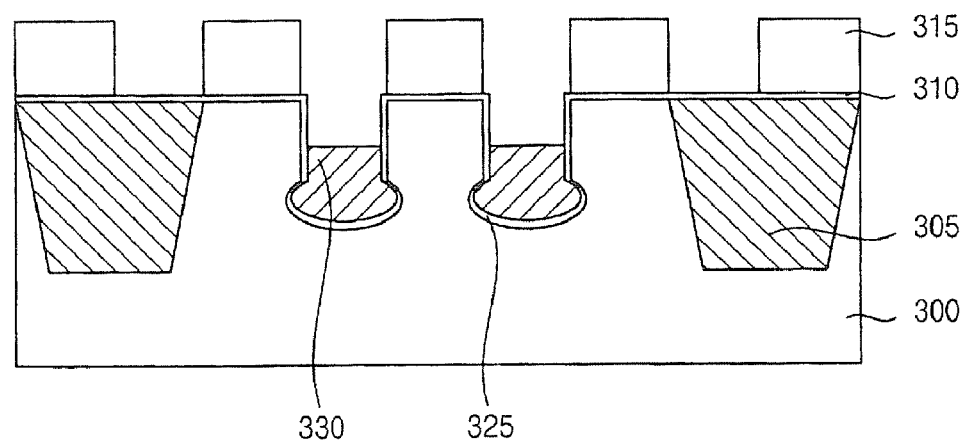

Referring to FIGS. 21 and 25, a lower electrode layer (not shown) may be formed on the hard mask pattern 315 to a sufficient thickness to fill up the recessed portion 320 of the substrate 300. For example, the lower electrode layer may comprise polysilicon. Then, the lower electrode layer may be partially removed from the substrate 300 by an etch-back process, and thus only remain at the lower portion of the recessed portion 320. Therefore, a lower electrode 330 of the SRCAT structure may be formed at the lower portion of the recessed portion 320. A residual portion of the recessed portion 320 excluding the lower portion may provide a space in which a bridge-shaped inner spacer of the present inventive concept may be positioned, and thus the thickness of the bridge-shaped inner spacer may be determined by the thickness of the lower electrode 330. Accordingly, the lower electrode 330 may be formed to such a sufficient thickness that the bridge-shaped inner spacer may have a sufficient thickness to prevent GIDL in the SRCAT structure in the residual space of the recessed portion 320, because the GIDL may be significantly determined by the thickness of the bridge-shaped inner spacer in the recessed portion 320. In the present example embodiment, the lower electrode 330 may have a thickness of about 500 Å to about 1,000 Å.

Particularly, since the enlarged portion 321 of the recessed portion 320 may be much larger than the upper portion of the recessed portion 320, a void may be generated between the lower electrode 330 and the bottom of the recessed portion 320. For that reason, the lower electrode 330 may be formed into a double-layer structure in view of a flow degree of a layer. For example, a heavily doped polysilicon layer may be firstly formed at the bottom of the recessed portion 320 and a lightly doped polysilicon layer may be secondly formed on the heavily doped polysilicon layer, to thereby prevent the void between the lower electrode 235 and the enlarged portion 321 of the recessed portion 320 while forming the lower electrode layer 330 in the recessed portion 320 of the SRCAT structure.

Figure 26:
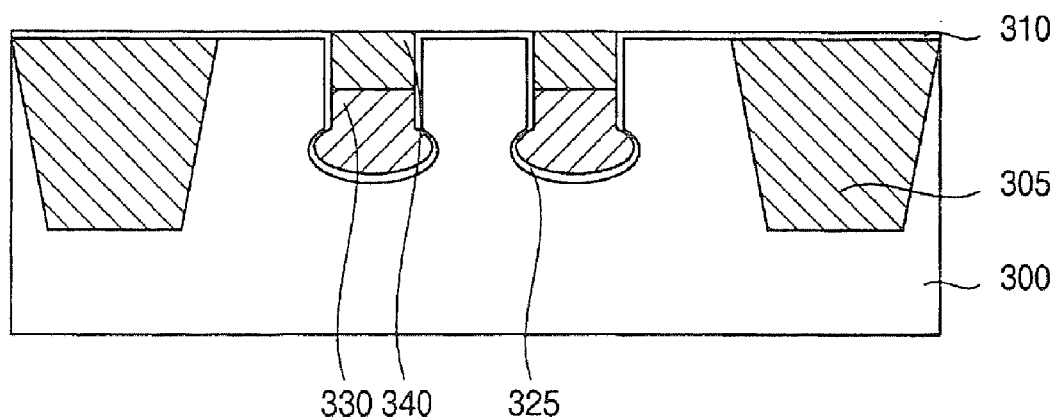

Referring to FIGS. 21 and 26, a spacer layer (not shown) may be formed on the hard mask pattern 315 to a sufficient thickness to fill up the residual portion of the recessed portion 320, and then the spacer layer and the hard mask pattern 315 may be planarized until a surface of the buffer oxide layer 310 may be exposed. Therefore, the spacer layer may only remain in the residual portion of the recessed portion 320 of the substrate 300, to thereby form a bridge-shaped inner spacer 340 on the lower electrode 330. That is, the gate insulation layer 325, the lower electrode 330 and the bridge-shaped inner spacer 340 may be sequentially stacked in the recessed portion 320 of the substrate 300.

Figure 27:
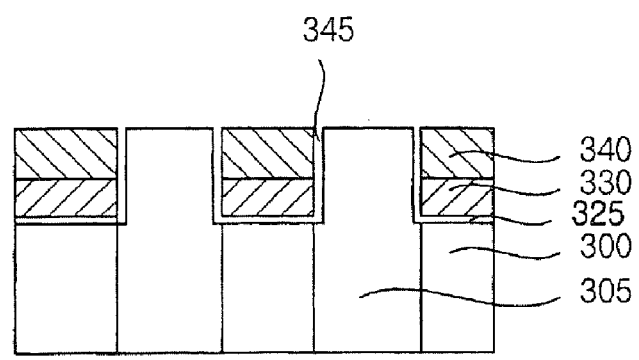
Figure 28A:
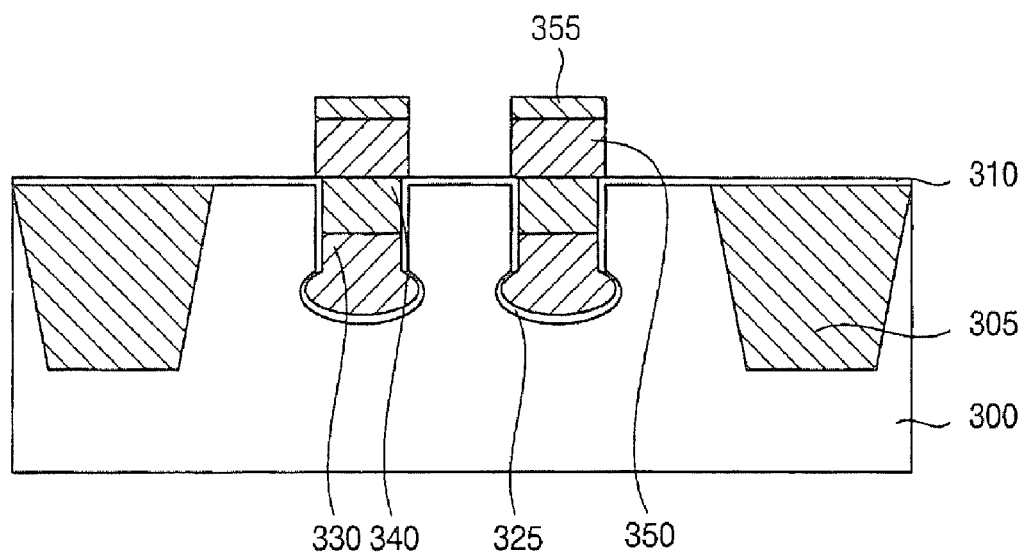
Figure 28B:
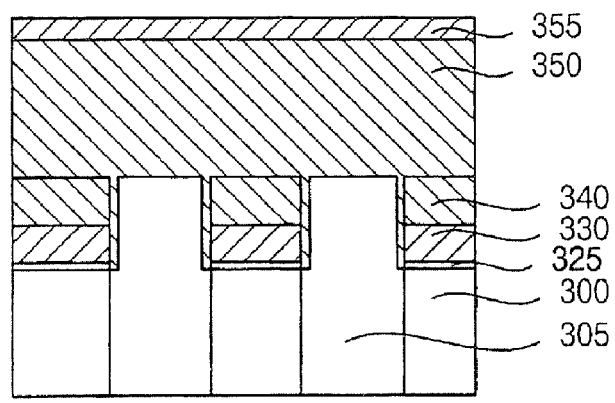

Referring to FIGS. 21 and 27, a photoresist pattern (not shown) may be formed on the substrate 300 including the bridge-shaped inner spacer 340 in such a manner that a boundary region between the active region and the field region of the substrate 300 may be exposed through the photoresist pattern in a direction of the B-B' line and the active region and the field region may be sufficiently covered with the photoresist pattern in a direction of the A-A' line. That is, the peripheral portions of the device isolation patterns 305 arranged in a direction of the B-B' line may be exposed through the photoresist pattern. Then, the peripheral portions of the device isolation patterns 305 along the B-B' line may be etched off by an etching process using the photoresist pattern as an etching mask, to thereby form a connection opening 345 between the device isolation pattern 305 and a stacked structure of the gate insulation layer 325, the lower electrode 330 and the bridge-shaped inner spacer 340. That is, the recessed portion 320 may be enlarged along the B-B' line by the removal of the peripheral portions of the device isolation patterns 305. In a subsequent process, a connection electrode that may electrically connect the lower electrode 330 to an upper electrode (which will be described hereinafter) may be formed in the connection opening 345. The etching process for forming the connection opening 345 may cause damage to the gate insulation layer 325, and thus a thermal treatment may be additionally performed on the substrate 300 so as to cure the gate insulation layer 325 in the recessed portion 320.

Referring to FIGS. 21, 28A and 28B, an upper electrode 350 and a gate mask pattern 355 may be formed on the bridge-shaped inner spacer 340. In the present example embodiment, the upper electrode 350 may be connected to the lower electrode 330 in one body via the connection electrode through the connection opening 345 between the active region and the field region.

In an example embodiment, a gate conductive layer (not shown) and a gate mask layer (not shown) may be sequentially formed on the buffer oxide layer 310 and the bridge-shaped inner spacer 340. A conductive material for the gate conductive layer may be deposited into the connection opening 345 as well as onto the substrate 100, and the gate mask layer may be formed on the gate conductive layer. Then, the gate mask layer and the gate conductive layer may be patterned into a gate line that includes at least one gate electrode at each of the active region of the substrate 300 and extends along the B-B' line of FIG. 21. In an example embodiment, the gate electrode on each active region may include the lower electrode 330 positioned at a lower portion of the recessed portion 320 and the upper electrode 350 positioned on the bridge-shaped inner spacer 340. The lower electrode 340 and the upper electrode 350 may be connected to each other via the connection electrode through the connection opening 345.

While the above example embodiment discloses that the upper electrode 350 may include a single conductive layer, any other modified electrode known to one of ordinary skill in the art may also be utilized in place of or in conjunction with the single conductive layer. For example, a metal silicide layer may be utilized for forming the upper electrode 350.

The gate mask pattern 355 on the upper electrode 350 may protect the upper electrode in a subsequent process.

In an example embodiment, an upper surface of the bridge-shaped inner spacer 340 may make contact with the upper electrode 350 and a lower surface of the bridge-shaped inner spacer 340 may make contact with the lower electrode 330. First side surfaces of the bridge-shaped inner spacer 340, which may be normal to the A-A' line in FIG. 21, may make contact with the inner sidewalls of the recessed portion 320 through the medium of the gate insulation layer 325 and second side surfaces of the bridge-shaped inner spacer 340, which may be normal to the B-B' line in FIG. 21, may make contact with the connection electrode. Therefore, the bridge-shaped inner spacer 340 may be enclosed by the lower and upper electrodes 330 and 350 in the recessed portion 320. When source and drain regions of the SRCAT structure may be formed at surface portions of the active region around the upper electrode 350, the bridge-shaped inner spacer 340 under the upper electrode 350 may be shaped into a bridge across the source and drain regions through the medium of the gate insulation layer 325. That is, the bridge-shaped inner spacer 340 may extend under the upper electrode 350 along the A-A' line in FIG. 21 and may make contact with the source and drain regions through the medium of the gate insulation layer 325.

As shown in FIG. 2B, the connection opening 345 may be filled with the gate conductive layer, and thus the lower electrode 330 and the upper electrode 350 may be formed into one body through the connection opening 345. In addition, adjacent upper electrodes 350 neighboring in the B-B' line direction in FIG. 21 may be connected to each other, to thereby form the gate line extending in the B-B' line direction in FIG. 21. In an exemplary embodiment, the gate line may function as a word line (WL) in the memory device.

Figure 29:
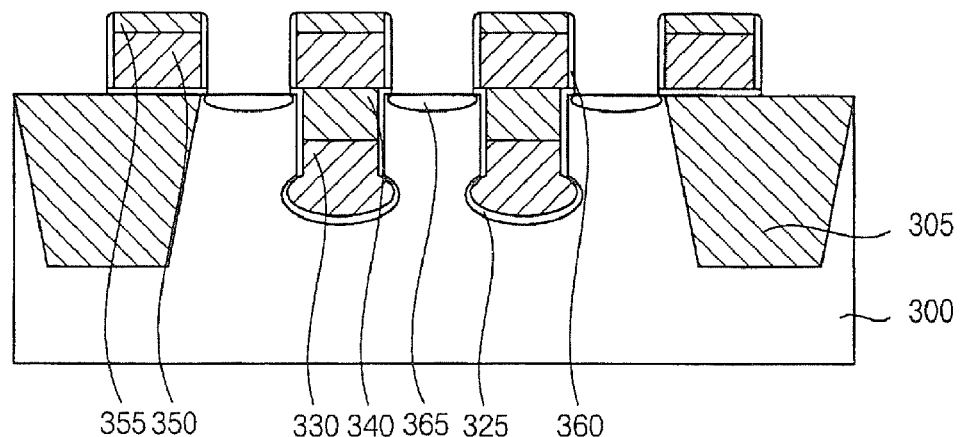

Referring to FIGS. 21 and 29, impurities may be lightly implanted onto the substrate 300 by an implantation process using the upper electrode 350 as an implantation mask, to thereby form a lightly doped region at surface portions of the active region of the substrate 300. Then, an outer spacer 360 may be formed on a sidewall of the upper electrode 350. Impurities may also be heavily implanted onto the substrate 300 by an implantation process using the outer spacer 360 as an implantation mask, to thereby form a heavily doped region at surface portions of the active region of the substrate 300. As a result, source/drain regions 365 may be formed on the active region of the substrate 300.

Accordingly, the source and the drain regions 365 may be formed at surface portions of the substrate 300 symmetrical to the gate electrode and peripheral portions of the source and drain regions 365 may make contact with the bridge-shaped inner spacer 340 under the upper electrode 350, and thus the source and drain regions 365 may be electrically separated from each other to a sufficient degree by the bridge-shaped inner spacer 340. The lower electrode 330 may be formed at the bottom portion of the recessed portion 320 of the substrate 300 and the upper electrode 350 and the lower electrode 330 may be integrally formed into the gate electrode in one body through the connection opening 345. That is, the bridge-shaped inner spacer 340 may be interposed between the upper electrode 350 and the lower electrode 330 of the gate electrode, to thereby sufficiently reduce GIDL at the gate electrode.

Figure 30:
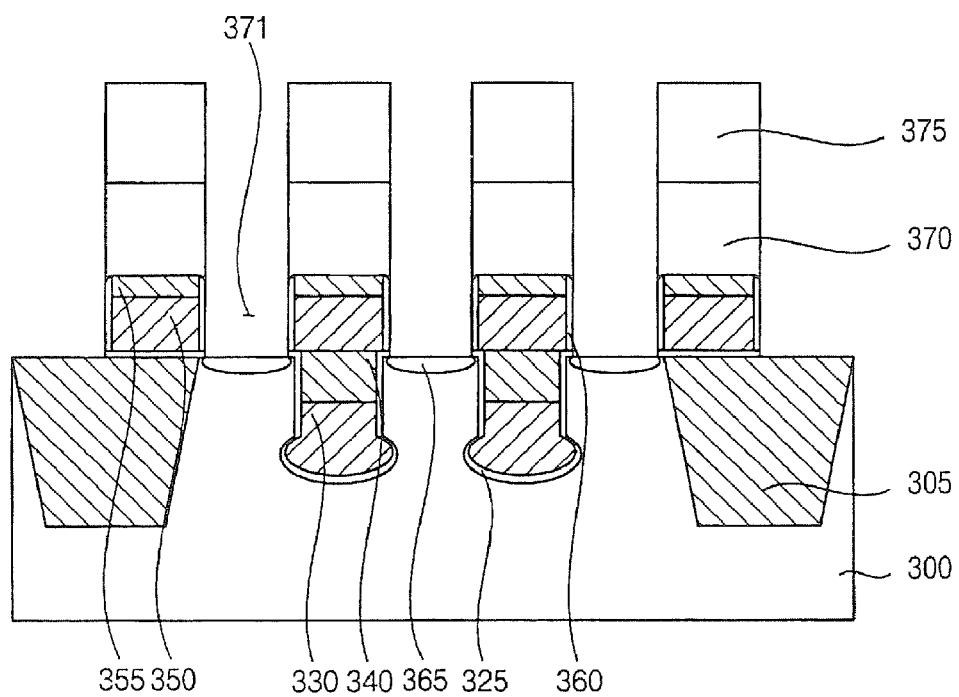

Referring to FIGS. 21 and 30, a first insulation interlayer (not shown) may be formed on the substrate 300 to a sufficient thickness to cover the upper electrode 350 and the gate mask pattern 355 and then an upper portion of the first insulation interlayer may be planarized by a planarization process such as a CMP process. Then, a photoresist pattern 375 may be formed on the first insulation interlayer by a photolithography process. The first insulation interlayer may be partially etched off by an etching process using the photoresist pattern 375 as an etching mask, to thereby form a first insulation interlayer pattern 370 having a contact hole 371 through which the source/drain regions 365 may be exposed. A bit line plug or a capacitor contact plug may be formed into the contact hole 371.

Figure 31:
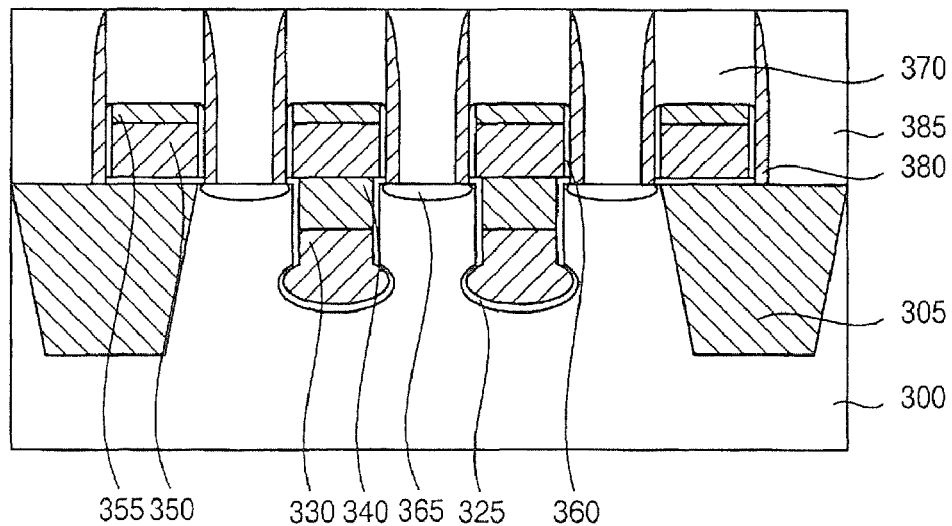

Referring to FIGS. 21 and 31, the photoresist pattern 375 may be removed from the first insulation pattern 370 and a sidewall spacer 380 may be formed on an inner sidewall of the contact hole 371. In an example embodiment, the sidewall spacer 380 may comprise a nitride and may be formed by a sequential process of a CVD process and an etch-back process.

A contact plug 385 may be formed in the contact hole 371 after the formation of the sidewall spacer 380. The contact plug 385 may include the capacitor contact plug electrically connected to a capacitor and the bit line contact plug electrically connected to a bit line. For example, the contact plug 385 may include a polysilicon layer heavily doped with impurities, a metal layer and a conductive metal nitride layer.

Figure 32:
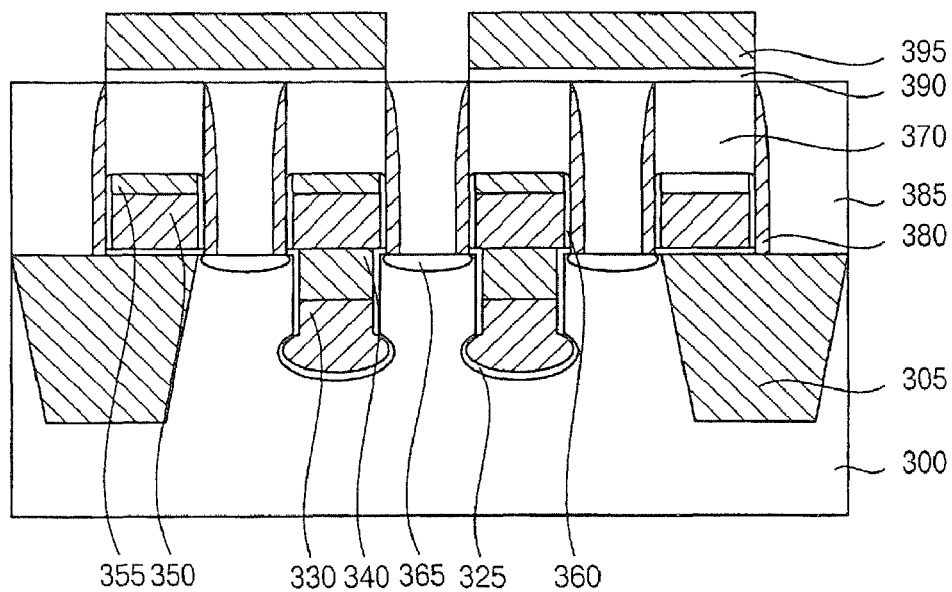

Referring to FIGS. 21 and 32, an etch-stop layer (not shown) and a second insulation interlayer (not shown) may be sequentially formed on the contact plug 385 and the first insulation interlayer pattern 370. For example, the second insulation interlayer may comprise borophosphosilicate glass (BPSG), phosphosilicate glass (PSG) or an oxide deposited by a CVD process such as a plasma-enhanced CVD (PECVD) or an HDP-CVD process. In the present example embodiment, the second insulation interlayer may include a silicon nitride layer deposited by a CVD process.

A first contact hole mask pattern (not shown) may be formed on the second insulation layer and the second insulation interlayer and the etch-stop layer may be partially etched off by an etching process using the first contact hole mask pattern as an etching mask, to thereby form an etch-stop pattern 390 and a second insulation interlayer pattern 395 through which a bit line contact plug 385 may be exposed.

Figure 33:
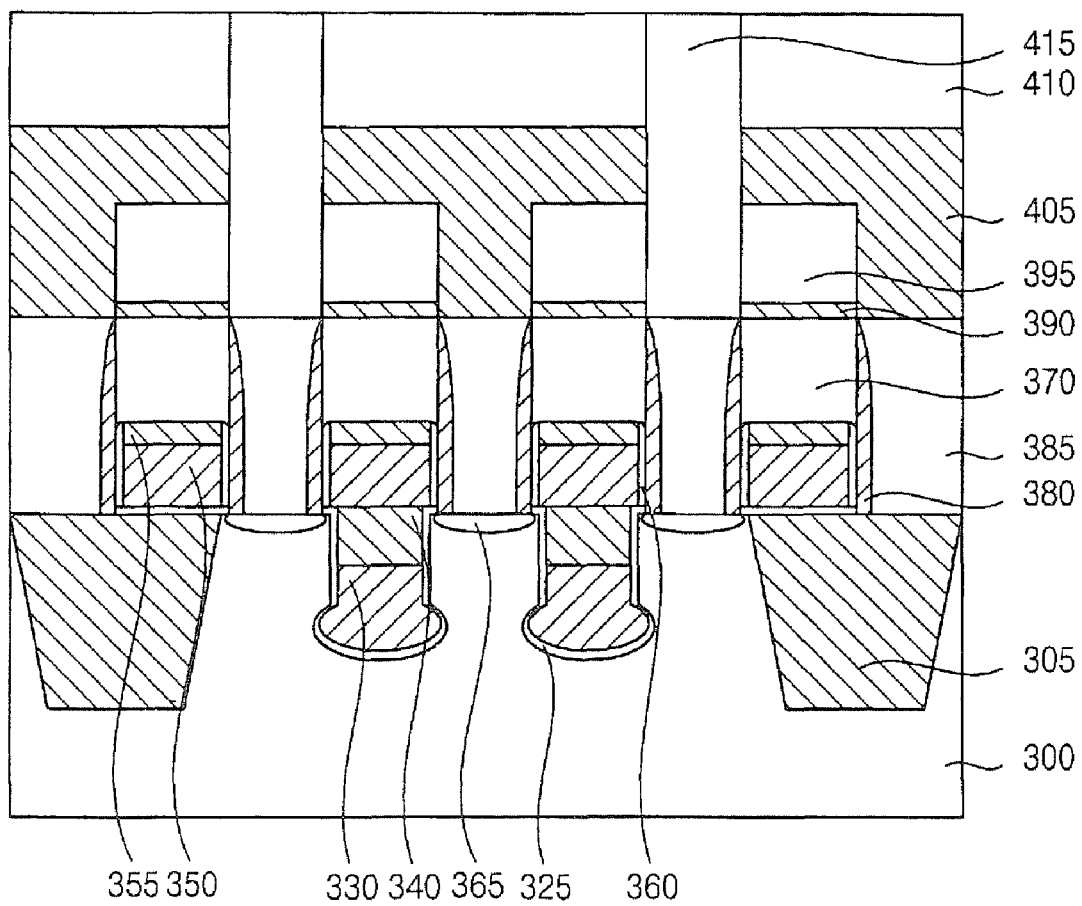

Referring to FIGS. 21 and 33, a conductive layer may be formed on the second insulation interlayer pattern 395, to thereby form a bit line 405 electrically connected to the bit line contact plug 385.

Then, a third insulation interlayer (not shown) may be formed on the bit line. For example, the third insulation interlayer may comprise BPSG, PSG or an oxide deposited by a CVD process such as a PECVD or an HDP-CVD process.

A second contact hole mask pattern (not shown) may be formed on the third insulation interlayer and the third insulation interlayer and the second insulation interlayer pattern 395 and the etching stop layer pattern 390 under the third insulation interlayer may be partially etched off by an etching process using the second contact hole mask pattern as an etching mask, to thereby form a third insulation interlayer pattern 410 having an opening through which a capacitor contact plug 385 may be exposed.

Then, a conductive layer may be formed on the third insulation interlayer pattern 410 to a sufficient thickness to fill up the opening, to thereby form a capacitor contact pad 415 in the opening that is electrically connected to the capacitor contact plug 385. For example, the capacitor contact pad 415 may include a polysilicon layer heavily doped with impurities.

Figure 34:
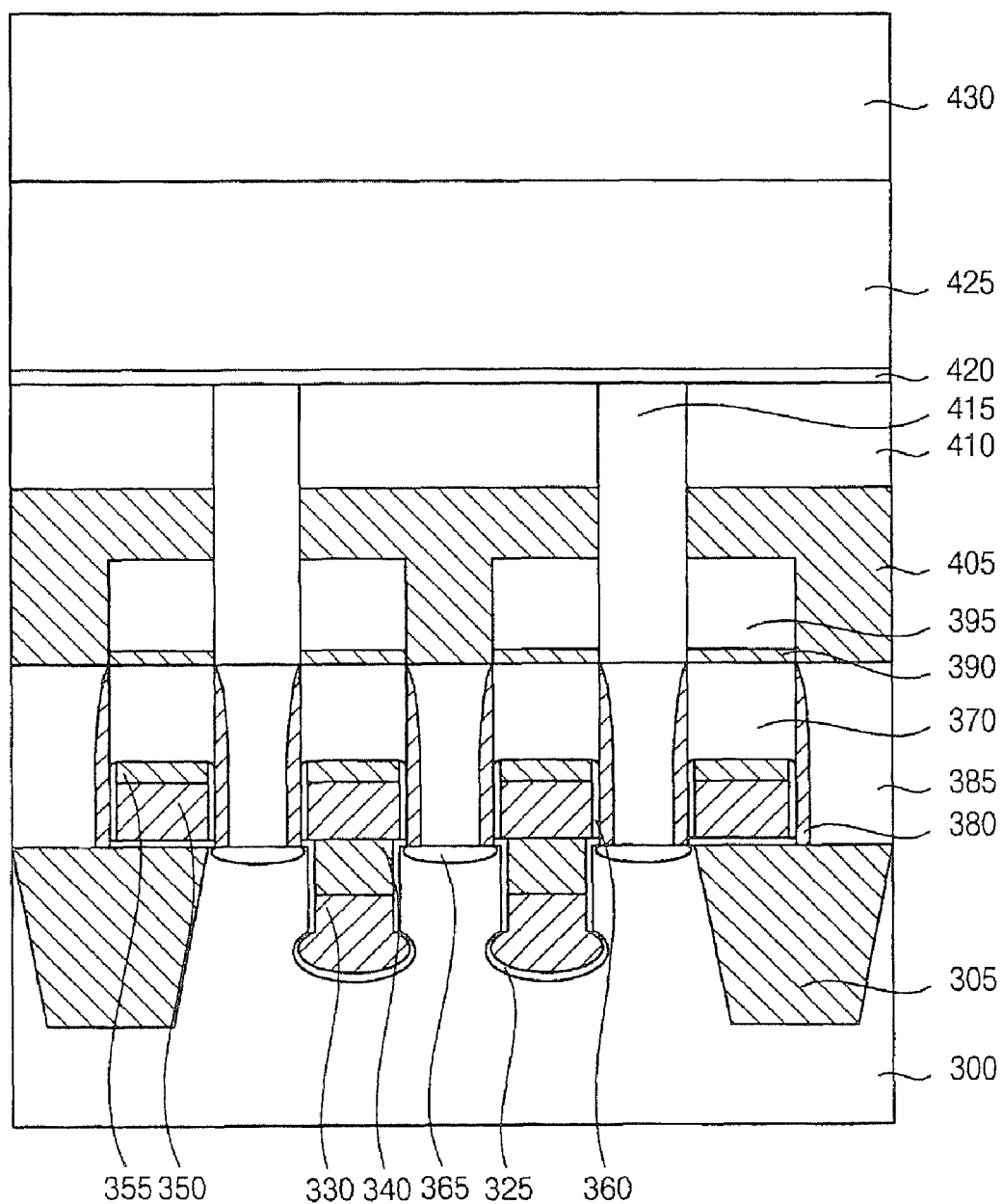

Referring to FIGS. 21 and 34, an additional etch-stop layer 420 may be formed on the third insulation interlayer pattern 410 and the capacitor contact pad 415. For example, the additional etch-stop layer 420 may comprise silicon nitride deposited by a CVD process. A mold layer 425 may be formed on the additional etch-stop layer 420 to a thickness of about 10,000 Å to about 20,000 Å. For example, the mold layer 425 may comprise an oxide deposited by a CVD process.

Then, a photoresist layer 430 may be formed on the first mold layer 425 and may be patterned into a photoresist pattern (not shown) for forming a lower electrode of a capacitor.

Figure 35:
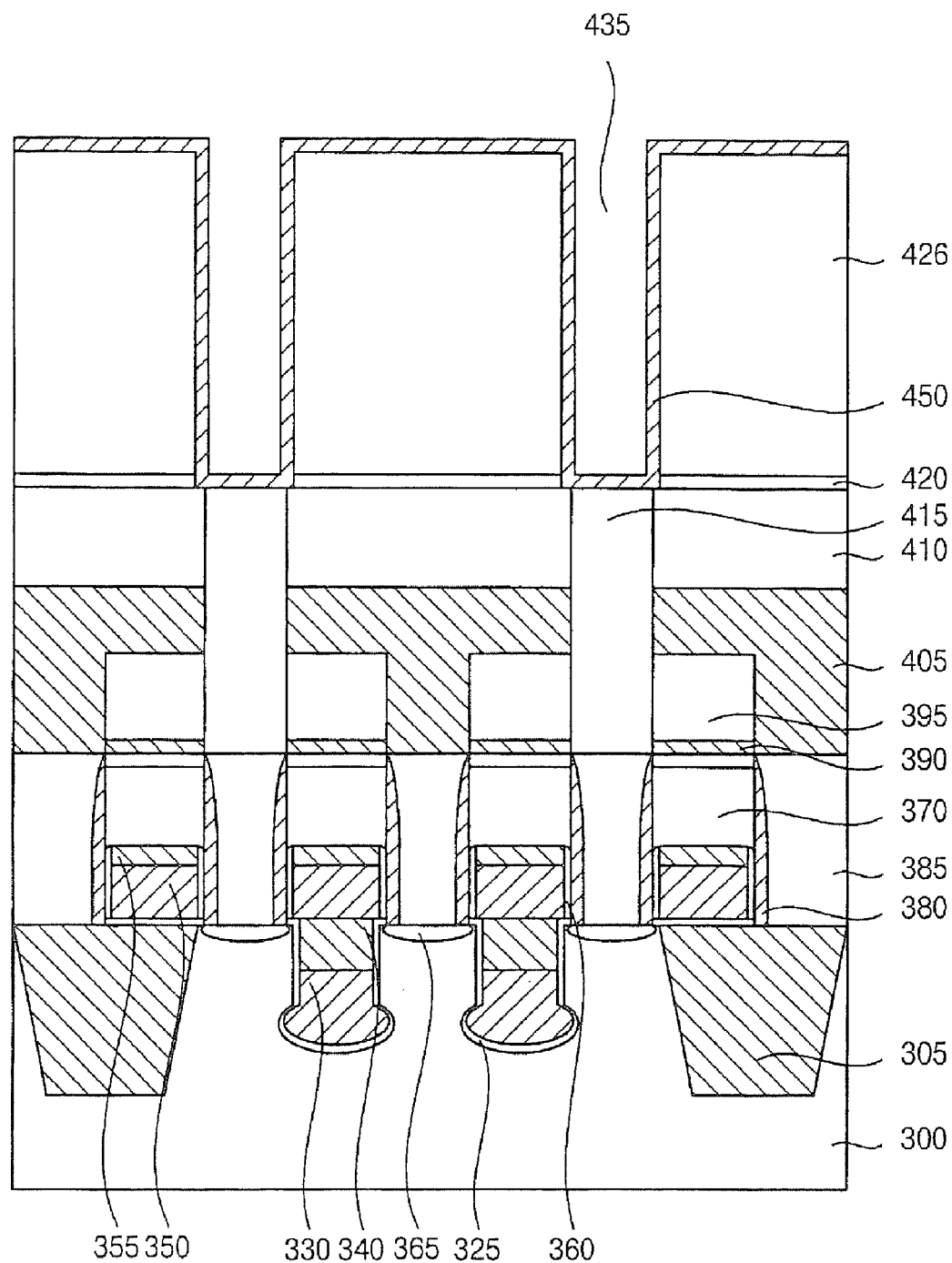

Referring to FIGS. 21 and 35, the mold layer 425 may be partially etched off by an etching process using the photoresist pattern as an etching mask, to thereby form a mold pattern 426 having a mold opening 435 through which the capacitor contact pad 415 may be exposed. For example, the mold layer 425 may be etched off by a dry etching process until the additional etch-stop layer 420 may be exposed. That is, the additional etch-stop layer 420 may indicate a terminal point of the dry etching process.

Then, the additional etch-stop layer 420 exposed through the mold opening 435 may be removed from the capacitor contact pad 415 and the photoresist pattern may be removed from the mold pattern 426. A lower electrode layer 450 may be formed on the mold pattern 426 and inner sidewall and bottom of the mold opening 435. For example, the lower electrode layer 450 may comprise conductive material such as titanium nitride (TiN), titanium (Ti), tantalum nitride (TaN), platinum (Pt), etc. The lower electrode layer 450 may make direct contact with the capacitor contact pad 415. In the present example embodiment, the etch-stop layer 420 may have a sufficient thickness to prevent a lower electrode of the capacitor from being broken after a node separation of the lower electrode layer 450. That is, the leaning failure or a separation failure from the capacitor contact pad 415 may be sufficiently prevented by the additional etch-stop layer 420.

Figure 36:
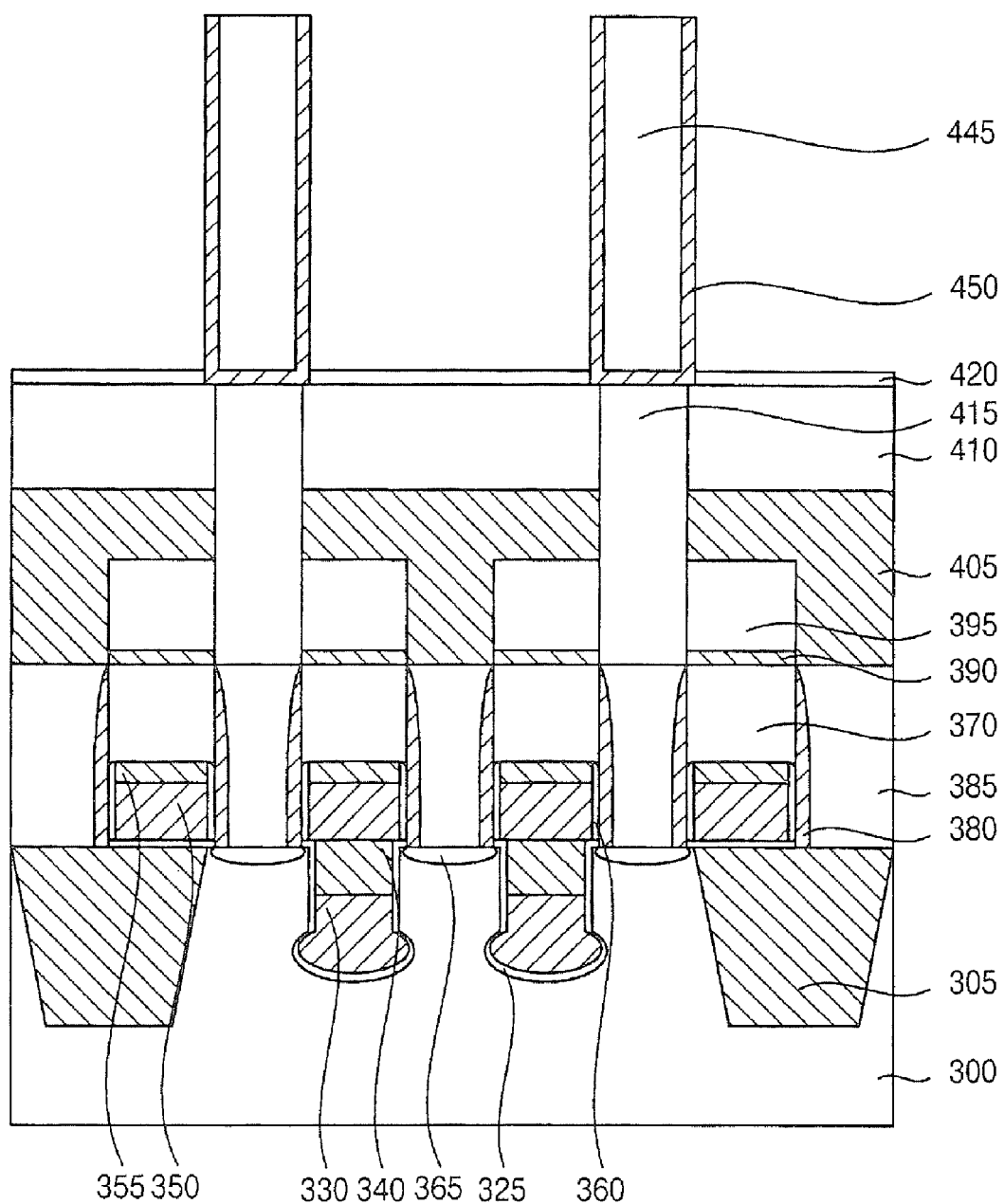

Referring to FIGS. 21 and 36, a sacrificial layer (not shown) may be formed on the lower electrode layer 450 to a sufficient thickness to fill up the mold opening 435. In an example embodiment, the sacrificial layer may comprise Tonen Silazene (TOSZ) having good gap-fill characteristics or an organic material and may have an etching selectivity different from that of the mold layer 425. Accordingly, the mold pattern 426 may be removed from the substrate 300 while the sacrificial layer may remain in the mold opening 435.

Then, the sacrificial layer and the lower electrode layer 450 may be planarized by a planarization process until a top surface of the mold pattern 426 may be exposed. Therefore, the lower electrode layer may only remain on the inner sidewall and bottom of the mold opening 435, to thereby complete a node separation of the lower electrode layer and to form a lower electrode 450. In addition, the sacrificial layer may only remain in the mold opening 435, to thereby form a sacrificial pattern 445 on the substrate 300 in accordance with the mold opening 435. For example, the planarization process may include a wet etch-back process.

In the present example embodiment, the sacrificial layer may be over-etched back in such a manner that a top surface of the sacrificial pattern 445 may be slightly lower than an upper surface of the lower electrode 450, and then a tip portion of the lower electrode 450 may be wet-etched off after the planarization process against the sacrificial layer. Thus, the tip portion of the lower electrode 450 may be formed into a round shape without a sharp shape, to thereby prevent separation of a dielectric layer and charge leakage in the capacitor.

Thereafter, the mold pattern 426 and the sacrificial pattern 445 may be removed from the substrate 300 by a lift-off process using a limulus amoebocyte lysate (LAL) solution, and thus only the lower electrode 450 may remain on the capacitor contact pad 415. In the present example embodiment, the additional etch-stop layer 420 may have a sufficient thickness to prevent a leaning failure of the lower electrode 450. Otherwise, various support members may be formed at the lower electrode 450 so as to prevent the leaning failure of the lower electrode 450. For example, the support member may include a trapezoidal or a ring-shaped insulating structure.

Figure 37:
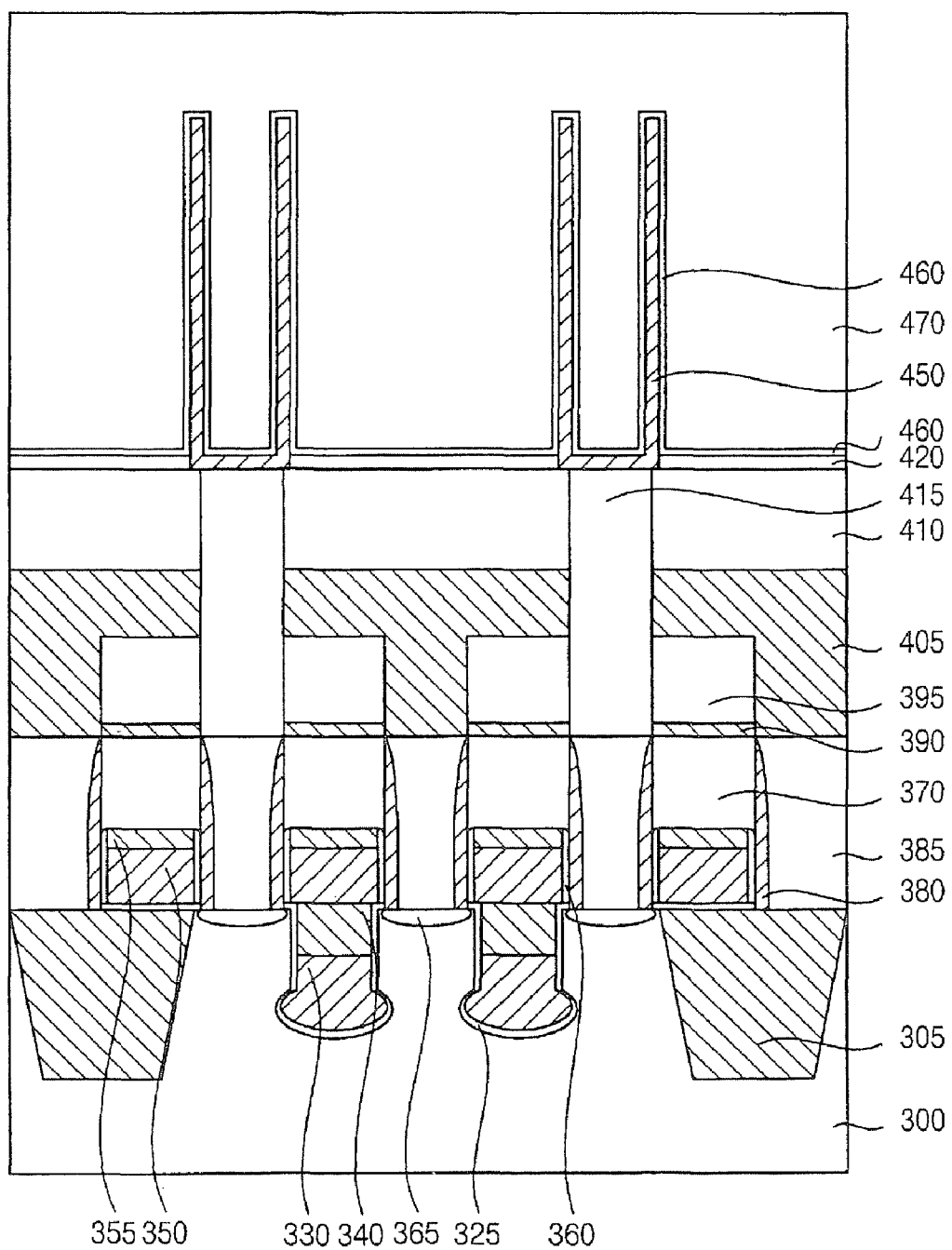

Referring to FIGS. 21 and 37, a dielectric layer 460 may be formed on the additional etch-stop layer 420 and the lower electrode 450 by a deposition process. For example, the dielectric layer 460 may include a zirconium oxide layer deposited by an atomic layer deposition (ALD) process. Particularly, the substrate 300 including the lower electrode 450 may be loaded into a process chamber and tetrakis-ethylmethylamino zirconium (Zr[N(C2H5)2)]4, TEMAZ) may be supplied into the process chamber as a precursor for the zirconium oxide layer. Then, some of source gases including the precursors may be chemisorbed onto the substrate 300 having the lower electrode 450 and residuals of the source gases that are not chemisorbed onto the substrate 300 may be purged from the process chamber by a first purge gas. The first purge gas may include an inactive gas such as argon (Ar) gas, helium (He) gas and nitrogen (N2) gas. Accordingly, the precursors may be deposited onto the lower electrode 450 and the additional etch-stop layer 420 to the thickness of an atomic degree. The precursors may be supplied into the process chamber at a relatively low temperature of about 250° C., and thus the chemisorption of the precursors onto the lower electrode 450 may be uniformly performed in spite of a high aspect ratio of the lower electrode 450. Particularly, the precursors may be uniformly deposited onto a bottom of the cylindrical lower electrode 450 without closing an entrance of the cylindrical lower electrode 450, and thus the dielectric layer 460 may be formed on the lower electrode 450 with a high degree of step coverage.

Then, reaction gases including an oxidant may be supplied into the process chamber at a temperature of about 275° C. Examples of the oxidant may include oxygen (O2) gas, ozone (O3) gas and water vapor (H2O), etc. These may be used alone or in combinations thereof. In the present example embodiment, ozone (O3) gas may be used as the oxidant for the zirconium oxide layer. Some of the reaction gases may be chemically reacted with the chemisorbed precursors and byproducts of the chemical reaction may be generated in the process chamber. Particularly, carbon and/or nitrogen in the precursor may be sufficiently oxidized and may be removed form the precursors, to thereby form the zirconium oxide layer on the lower electrode 450 in the process chamber. The byproducts of the chemical reaction and residuals of the reaction gases that are not reacted with the chemisorbed precursors may be purged from the process chamber by a second purge gas, to thereby complete a unit cycle of the ALD process. Then, the TEMAZ layer may be formed on the additional etch-stop layer 420 and the lower electrode 450 to a unit atomic thickness. A proper repetition of the unit cycle of the ALD process may provide a desired thickness to the dielectric layer 460 comprising TEMAZ. In the present example embodiment the unit cycle of the ALD process may be repeated about 100 to about 150 times and the dielectric layer 460 may be uniformly formed on the lower electrode 450 and the additional etch-stop layer 420 to a thickness of about 100 Å to about 150 Å.

Since the TEMAZ precursors may be supplied into the process chamber at a relatively lower temperature while the reaction gases for the oxidation reaction with the precursors may be supplied at a relatively higher temperature, the zirconium oxide layer may have good step coverage in spite of the high aspect ratio of the lower electrode 450.

In a modified example embodiment, the dielectric layer 460 may be formed into a multilayer structure. For example, a zirconium oxynitride layer (not shown) may be further formed on the zirconium oxide layer, to thereby form a double-layer structure on the lower electrode 450 as the dielectric layer 460.

While the above example embodiment discloses the zirconium oxide layer and/or the zirconium oxynitride layer as the dielectric layer 460, the dielectric layer may include any other material having a high dielectric constant know to one of ordinary skill in the art in accordance with the process conditions and requirements. Examples of the materials having a high dielectric constant may include ZrO2/Al2O3/ZrO2 (ZAZ), ZrO2/Al2O3/TaO2 (ZAT), Hf2O3, etc. These may be used alone or in combinations thereof.

Although the composition of the dielectric layer 460 may be varied in accordance with the process conditions and requirements, the step coverage of the dielectric layer 460 may be sufficiently improved in spite of the high aspect ratio of the lower electrode 450 only if the precursors are supplied at a relatively lower temperature and the reaction gases including the oxidants are supplied at a relatively higher temperature.

In an example embodiment, an upper electrode layer 470 may be formed on the dielectric layer 460. For example, the upper electrode layer 470 may comprise a conductive material such as titanium nitride (TiN), titanium (Ti), tantalum nitride (TaN) and platinum (Pt). As a result, a capacitor (not shown) may be formed on the substrate 300 and may be electrically connected to the capacitor contact pad 415.

Thereafter, an insulation interlayer (not shown) may be formed on the capacitor and a metal wiring that is electrically connected to the capacitor may be formed on the insulation interlayer, to thereby form the DRAM device having the bridge-shaped inner spacer in the recessed portion of the substrate and the capacitor having good step coverage in spite of a high aspect ratio. That is, GIDL at the gate electrode and the charge leakage at the capacitor may be sufficiently prevented in the DRAM device of the present example embodiment of the inventive concept.

Particularly, the above DRAM device may include the RCAT/SRCAT structure in which the source and drain regions may make contact with an insulation layer in the recessed portion of the substrate like a bridge as the inner spacer, to thereby sufficiently prevent the GIDL at the gate electrode and to sufficiently improve the refresh time of the DRAM device.

System Including Semiconductor Device Having the RCAT Structure

Figure 38:
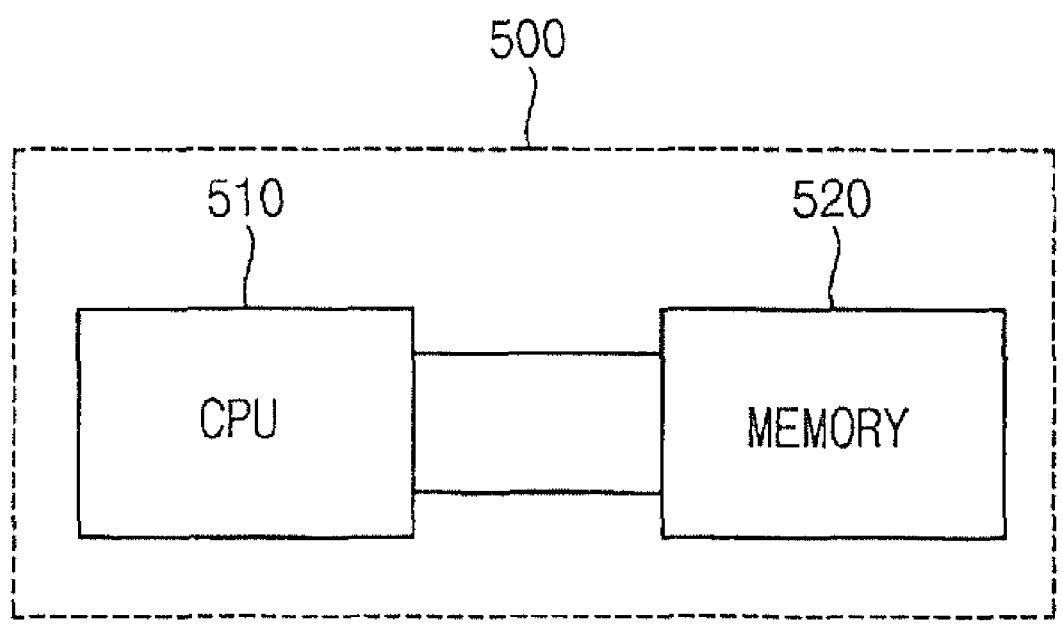
FIG. 38 is a schematic block diagram illustrating a system including the semiconductor device shown in FIG. 37 in accordance with an example embodiment of the present inventive concept.

FIG. 38 is a structural view illustrating a system including the semiconductor device shown in FIG. 37 in accordance with an example embodiment of the present inventive concept.

Referring to FIG. 38, the system 500 of the present example embodiment may include a central processing unit (CPU) 510 for processing various kinds of data and a memory unit 520 for temporarily storing the processed data. In an example embodiment, the memory unit 520 may include the DRAM device shown in FIG. 37 in which the RCAT/SRCAT structure having a bridge-shaped inner spacer may be formed as a transistor. Examples of the system 500 may include a computer system such as a notebook computer or a desktop computer having the DRAM device and other electronic devices having the CPU unit and the memory unit electrically connected to the CPU unit. In addition, the system 500 may also include various digital-based equipment of which the operation may be controlled by a digital signal from the CPU and various operational data may be stored in a memory electrically connected to the CPU via a bus line. FIG. 38 illustrates basic and requisite structural elements of the digital equipment or the electronic devices, and thus the present example embodiment of the present inventive concept may be applied to various digital equipment and electronic devices by adding proper structural elements to the system 500 shown in FIG. 38.

According to the example embodiments of the present inventive concept, a bridge-shaped inner spacer may be formed in the gate electrode of a transistor, and thus GIDL may be sufficiently reduced in the transistor, to thereby significantly improve the refresh time of the transistor in spite of the downsizing of a minimum feature size of a semiconductor device and to increase the degree of integration of the semiconductor device.

Particularly, in the case of a DRAM device including the above RCAT/SRCAT structure, the source and drain regions may make contact with an inner spacer in the recessed portion of the substrate like a bridge, to thereby sufficiently prevent the GIDL at the gate electrode. In addition, a word line of the DRAM device may be expanded to a field area to thereby increase a gate current and reduce electrical resistance of the word line.

In addition, the DRAM device including the bridge-shaped inner spacer in the gate electrode of the RCAT/SRCAT structure may sufficiently improve the reliability and performance of digital equipment and/or electronic devices using the DRAM device as a memory unit thereof.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
   a semiconductor substrate including an active region and a non-active region defined by a device isolation layer, the active region including a recessed portion in the substrate;
   a gate electrode including a gate insulation layer on an inner sidewall and on a bottom of the recessed portion, a lower electrode on the gate insulation layer located in a lower portion of the recessed portion, an inner spacer on the lower electrode located at an upper portion of the recessed portion, and an upper electrode that is positioned on the inner spacer and electrically connected to the lower electrode; and
   source and drain impurity regions at surface portions of the active region of the substrate adjacent to the upper electrode, the source and drain impurity regions being electrically insulated by the inner spacer; and
   wherein a lower surface of the inner spacer is lower than the source and the drain impurity regions and an upper surface of the inner spacer is at a level equal to or lower than a surface of the substrate, so that the inner spacer is between the source and drain impurity regions under the upper electrode.

2. The semiconductor device of claim 1, wherein the inner spacer includes silicon nitride.

3. The semiconductor device of claim 1, wherein the bottom of the recessed portion comprises a hemisphere shape, so that the lower electrode includes a at least a portion of a spherical surface.

4. The semiconductor device of claim 1, wherein the gate insulation layer is between the inner spacer and the lower electrode in the recessed portion of the substrate.

5. The semiconductor device of claim 1, wherein the lower electrode and the inner spacer make direct contact with each other in the recessed portion of the substrate.

6. A semiconductor device comprising:
   a semiconductor substrate including an active region and a non-active region defined by a device isolation layer, the active region including a recessed portion in the substrate;
   a gate electrode including a gate insulation layer on an inner sidewall and on a bottom of the recessed portion, a lower electrode on the gate insulation layer located in a lower portion of the recessed portion, an inner spacer on the lower electrode located at an upper portion of the recessed portion, and an upper electrode that is positioned on the inner spacer and electrically connected to the lower electrode;
   source and drain impurity regions at surface portions of the active region of the substrate adjacent to the upper electrode, the source and drain impurity regions being electrically insulated by the inner spacer; and
   a connection electrode in a connection opening between a stacked structure of the lower electrode and the inner spacer and the device isolation layer at a boundary region of the recessed portion and the non-active region along a longitudinal direction of the recessed portion, the connection electrode connecting the upper electrode and the lower electrode to each other.

7. The semiconductor device of claim 6, wherein the connection electrode comprises a single unitary body together with the upper electrode and makes direct contact with the lower electrode.

8. A semiconductor device comprising:
   a semiconductor substrate including an active region and a non-active region defined by a device isolation layer, the active region including a recessed portion in the substrate;
   a gate electrode including a gate insulation layer on an inner sidewall and on a bottom of the recessed portion, a lower electrode on the gate insulation layer located in a lower portion of the recessed portion, an inner spacer on the lower electrode located at an upper portion of the recessed portion, and an upper electrode that is positioned on the inner spacer and electrically connected to the lower electrode; and
   source and drain impurity regions at surface portions of the active region of the substrate adjacent to the upper electrode, the source and drain impurity regions being electrically insulated by the inner spacer; and
   a bit line electrically connected to the drain impurity region and a capacitor electrically connected to the source impurity region.

9. The semiconductor device of claim 8, wherein the capacitor includes a first electrode electrically connected to the source impurity regions, a dielectric layer on the first electrode and a second electrode on the dielectric layer, and the first and second electrodes of the capacitor includes any one material selected from the group consisting of titanium nitride (TiN), titanium (Ti), tantalum nitride (TaN), platinum (Pt) and combinations thereof and the dielectric layer includes any one material selected from the group consisting of zirconium (Zr), hafnium oxide (HfO) and combinations thereof.

10. The semiconductor device of claim 8, wherein the bit line extends in a first direction parallel with the width of the recessed portion and a plurality of the gate electrodes is arranged in a line extending in a second direction substantially perpendicular to the first direction.

11. A method of forming a semiconductor device, comprising:
preparing a semiconductor substrate defined into an active region and a non-active region by a device isolation layer, the active region having a recessed portion on the substrate;
forming a gate electrode including a gate insulation layer on an inner sidewall and a bottom of a recessed portion of a substrate, a lower electrode on the gate insulation layer and an inner spacer on the lower electrode in the recessed portion, and an upper electrode that is positioned on the inner spacer and connected to the lower electrode;
forming source and drain impurity regions at surface portions of an active region of the substrate adjacent to the upper electrode, the source and drain impurity regions being electrically insulated by the inner spacer;
preparing the semiconductor substrate to include an active region and a non-active region defined by a device isolation layer, the active the recessed portion in the substrate, wherein preparing the semiconductor substrate includes:
forming a device isolation layer at the non-active region of the substrate, so that neighboring active regions are electrically isolated from each other; and
partially etching the active region of the substrate, to thereby form the recessed portion at the active region of the substrate, after forming the recessed portion, the method further comprising:
forming an etch-protection layer on an inner sidewall of the recessed portion; and
performing an isotropic etching process against the bottom of the recessed portion, so that the bottom of the recessed portion is shaped into a hemisphere.

12. The method of claim 11, wherein forming the gate electrode includes:
forming the gate insulation layer on an inner sidewall and a bottom of the recessed portion and on the substrate;
forming a lower electrode at a lower portion of the recessed portion;
forming the inner spacer on the lower electrode at an upper portion of the recessed portion;
forming a connection opening such that the recessed portion is enlarged along a longitudinal direction and the lower electrode under the inner spacer is exposed through the connection opening;
forming the connection electrode in the connection opening; and
forming the upper electrode on the substrate such that the inner spacer is covered with the upper electrode and the lower electrode is connected to the upper electrode via the connection electrode.

13. The method of claim 12, wherein the upper electrode and the connection electrode are formed into one body in a single process, and the connection electrode makes direct contact with the lower electrode.

14. A method of forming a semiconductor device, comprising:
preparing a semiconductor substrate defined into an active region and a non-active region by a device isolation layer, the active region having a recessed portion on the substrate;
forming a gate electrode including a gate insulation layer on an inner sidewall and a bottom of a recessed portion of a substrate, a lower electrode on the gate insulation layer and an inner spacer on the lower electrode in the recessed portion, and an upper electrode that is positioned on the inner spacer and connected to the lower electrode;
forming source and drain impurity regions at surface portions of an active region of the substrate adjacent to the upper electrode, source and drain impurity regions being electrically insulated by the inner spacer
wherein forming the gate electrode includes:
forming a sacrificial layer at a lower portion of recessed portion;
forming the inner spacer on the sacrificial layer at an upper portion of the recessed portion;
forming a connection opening such that the recessed portion is enlarged along a longitudinal direction and the sacrificial layer under the inner spacer is exposed through the connection opening;
removing the sacrificial layer from the recessed portion, to thereby form an electrode space at the lower portion of the recessed portion;
forming the gate insulation layer on an inner sidewall and a bottom of the recessed portion that define the electrode space and on the substrate;
forming the lower electrode and the connection electrode in the electrode space and in the connection opening, respectively; and
forming the upper electrode on the substrate such that the inner spacer is covered with the upper electrode and the lower electrode is connected to the upper electrode via the connection electrode.

15. The method of claim 14, wherein forming the connection opening includes:
forming a mask pattern through which a boundary region of the recessed portion and the non-active region is exposed along a longitudinal direction of the recessed portion, so that a stacked structure of the lower electrode and the inner spacer and the device isolation layer is partially exposed through the mask pattern; and
removing the stacked structure and the device isolation layer from the boundary region of the substrate by an etching process using the mask pattern as an etching mask.

16. The method of claim 14, wherein removing the sacrificial layer is performed by a wet etching process using an etchant supplied to the sacrificial layer through the connection opening.

17. The method of claim 14, wherein the inner spacer is enclosed by the gate insulation layer.

* * * * *